(12) United States Patent
Tanaka et al.

(10) Patent No.: US 6,768,163 B2
(45) Date of Patent: Jul. 27, 2004

(54) NONVOLATILE SEMICONDUCTOR MEMORY DEVICE AND NONVOLATILE SEMICONDUCTOR MEMORY SYSTEM

(75) Inventors: Tomoharu Tanaka, Yokohama (JP); Hiroshi Sukegawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 09/961,355

(22) Filed: Sep. 25, 2001

(65) Prior Publication Data

US 2002/0040990 A1 Apr. 11, 2002

(30) Foreign Application Priority Data

Sep. 29, 2000 (JP) ........................................ 2000-301063

(51) Int. Cl.[7] ............................ H01L 29/76; G11C 16/04
(52) U.S. Cl. ........................ 257/319; 257/315; 257/700; 365/185.17
(58) Field of Search ................................ 257/296, 314, 257/315, 319, 700; 365/185.17, 185.08, 185.19, 194, 207, 208, 189.01, 185.21, 185.23, 185.24; 725/111, 109

(56) References Cited

U.S. PATENT DOCUMENTS

| | | | | |
|---|---|---|---|---|
| 5,740,112 A | * | 4/1998 | Tanaka et al. | 365/189.01 |
| 5,905,476 A | * | 5/1999 | McLaughlin et al. | 345/781 |
| 5,941,969 A | * | 8/1999 | Ram et al. | 710/315 |
| 6,151,619 A | * | 11/2000 | Riddle | 709/204 |
| 6,219,708 B1 | * | 4/2001 | Martenson | 709/226 |
| 6,430,667 B1 | * | 8/2002 | Loen | 711/202 |
| 6,513,719 B1 | * | 2/2003 | Imura | 235/492 |
| 2003/0033286 A1 | * | 2/2003 | Burgess | 707/1 |

FOREIGN PATENT DOCUMENTS

JP 2000-49277 2/2000

* cited by examiner

*Primary Examiner*—Eddie Lee
*Assistant Examiner*—Douglas W. Owens

(57) ABSTRACT

A semiconductor integrated circuit device comprises a first semiconductor substrate and a second semiconductor substrate. A Memory cell array and word lines connected to the memory cell array each are provided in the first semiconductor substrate. A word line control circuit configured to control the word lines is provided in the second semiconductor substrate.

26 Claims, 21 Drawing Sheets

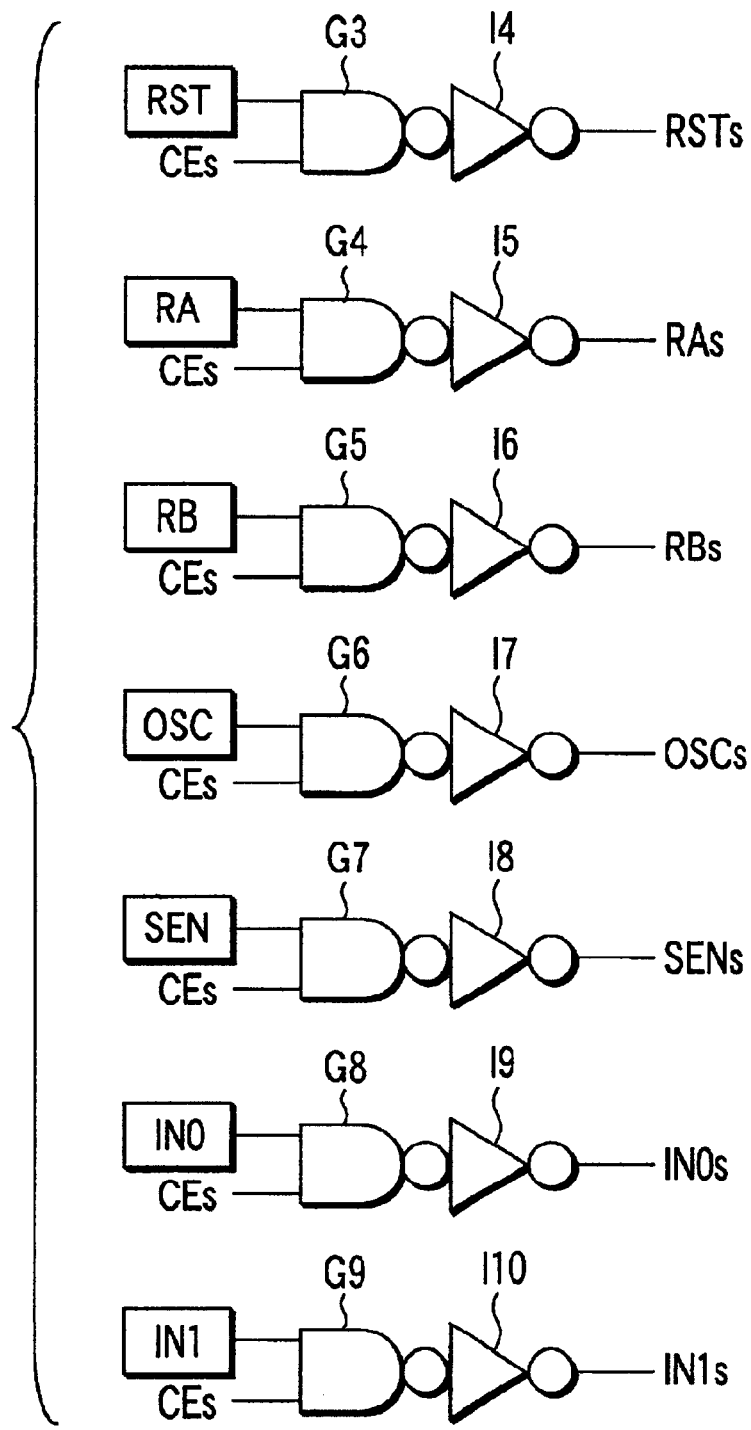
F I G. 14

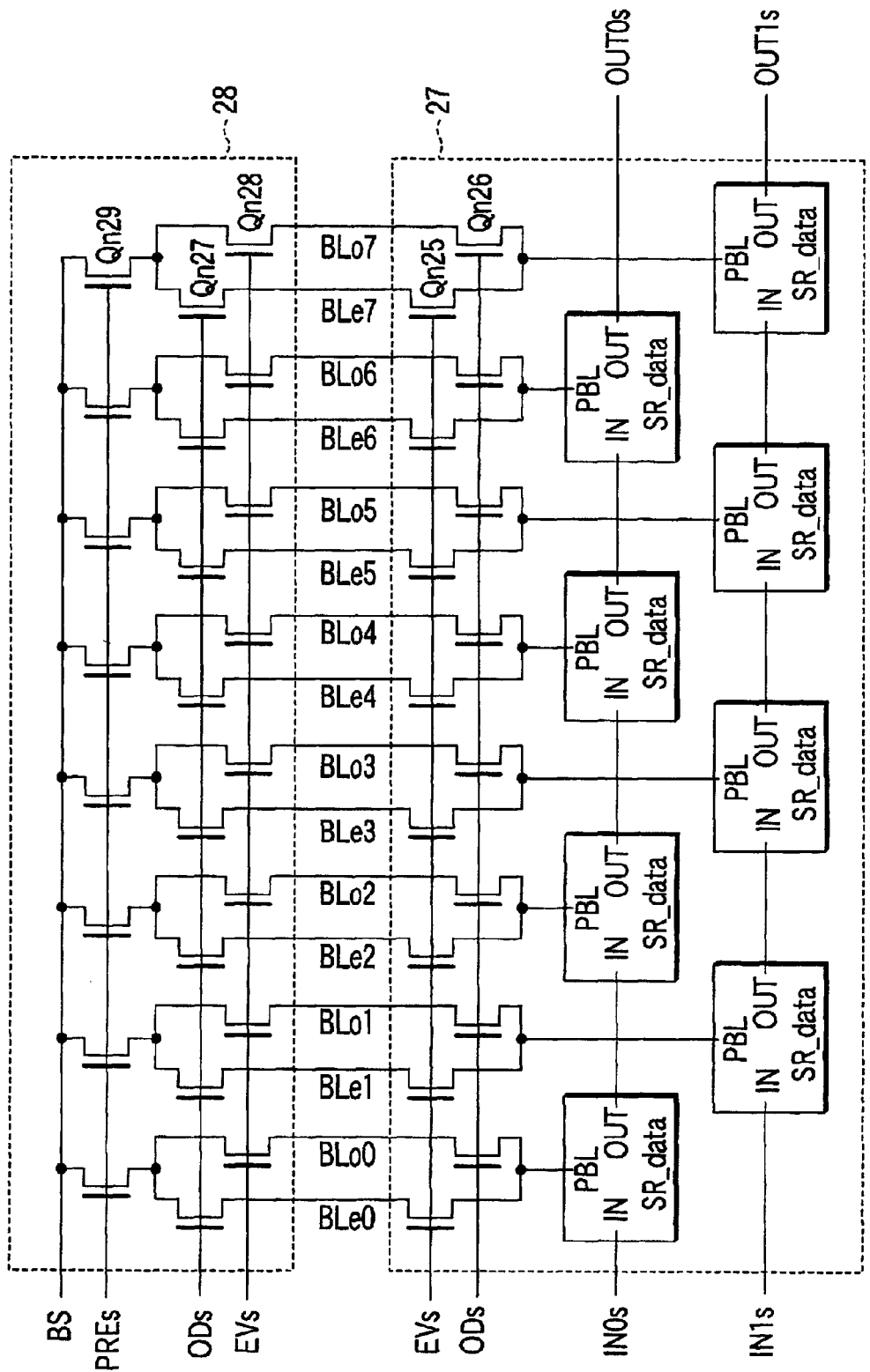
F I G. 21

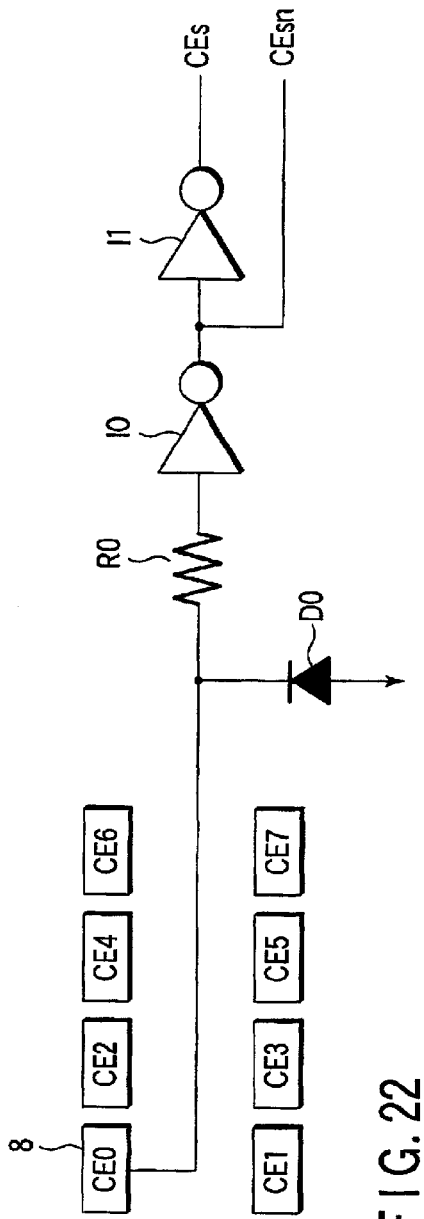
F I G. 22
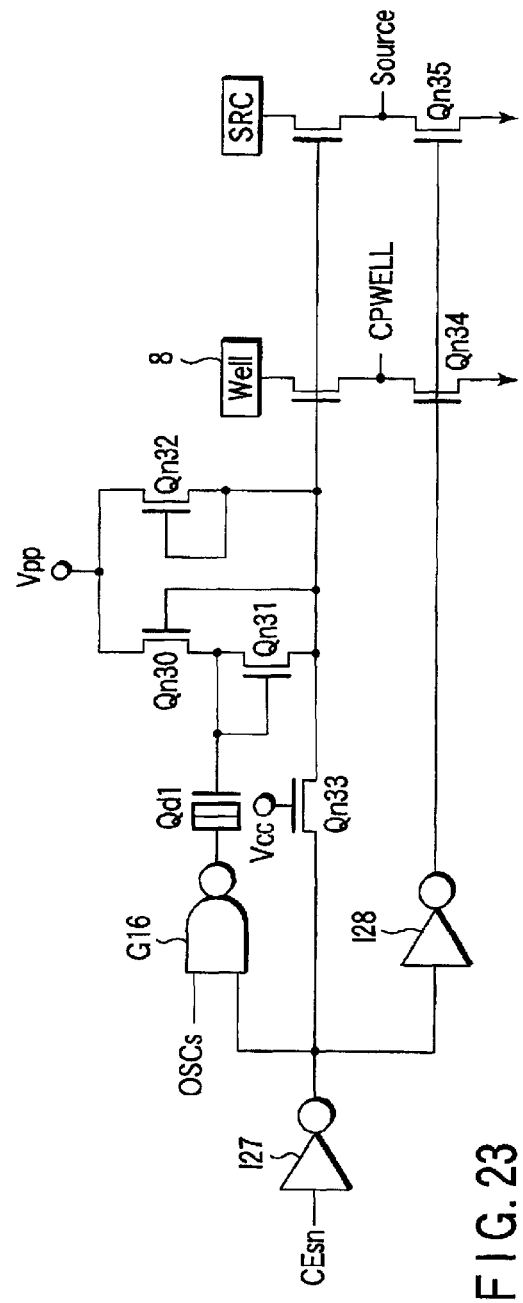
F I G. 23

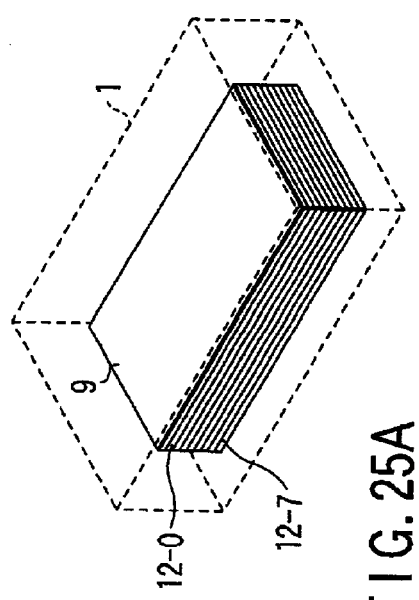
FIG. 25A
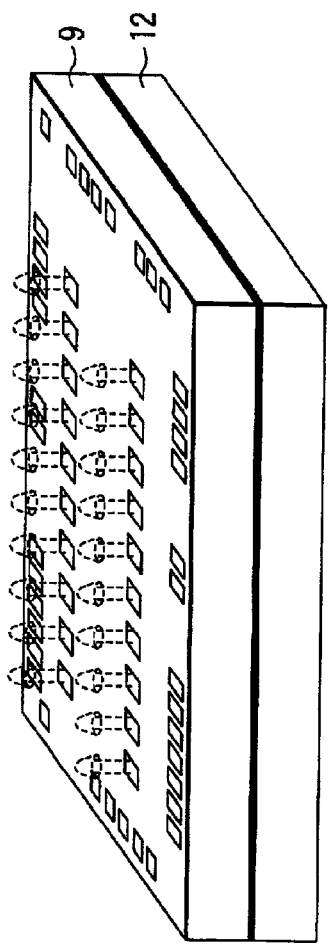
FIG. 25B
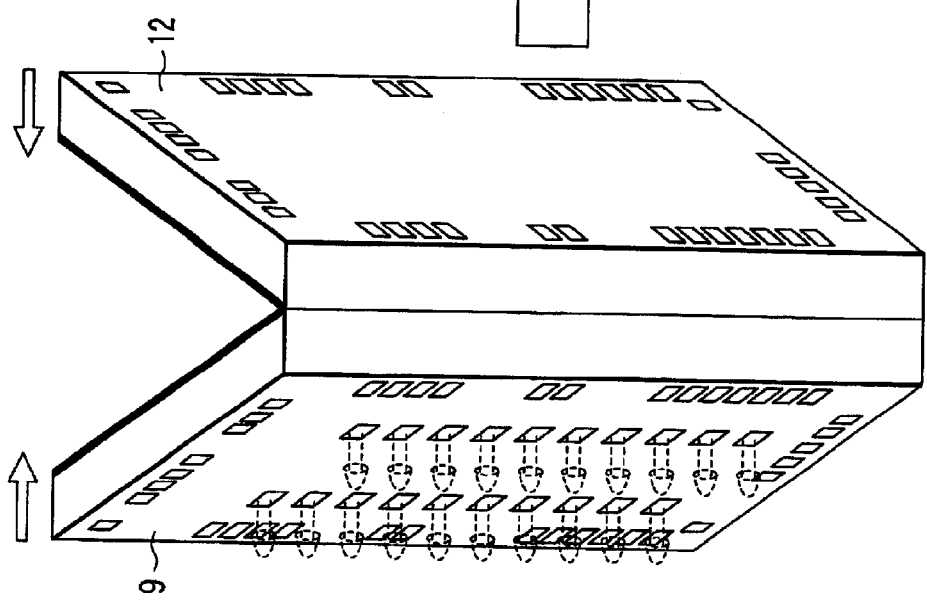

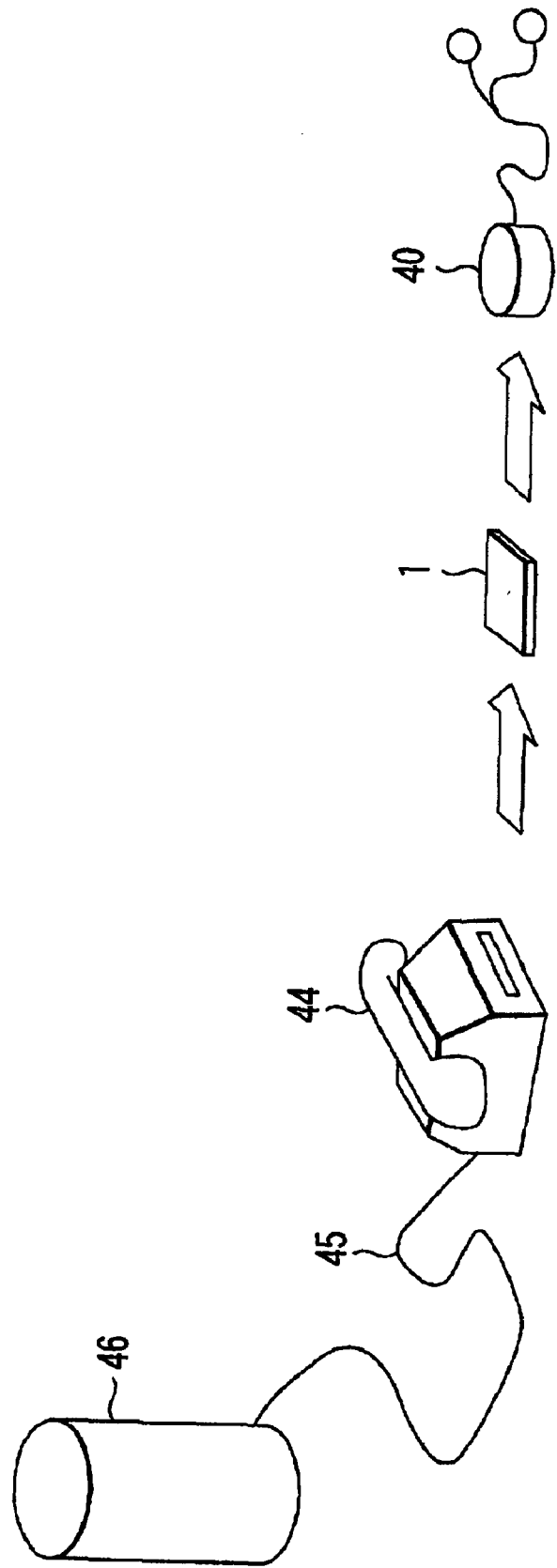
F I G. 28

NONVOLATILE SEMICONDUCTOR MEMORY DEVICE AND NONVOLATILE SEMICONDUCTOR MEMORY SYSTEM

CROSS-REFERENCE TO RELATED APPLICATIONS

This application is based upon and claims the benefit of priority from the prior Japanese Patent Application No. 2000-301063, filed Sep. 29, 2000, the entire contents of which are incorporated herein by reference.

BACKGROUND OF THE INVENTION

1. Field of the Invention

The present invention relates to an electrically rewritable nonvolatile semiconductor memory device, and a system thereof.

2. Description of the Related Art

A conventional flash memory has a digital control interface. Then, in addition to a digital control signal terminal, the flash memory has a power source terminal, and a writing and erasing power source terminal. These are DC inputs, which are controlled in accordance with a digital control signal from the outside inside of the flash memory to be rectified into an appropriate waveform and applied to a memory cell. As a consequence, a large number of control circuits which are referred to as peripheral circuits are provided in addition to the memory cells in order to create a signal required for the reading, writing, and erasing of the memory cell inside of the flash memories.

Conventionally, a large number of peripheral circuits are formed in a chip for creating a signal required for the reading, writing, and erasing of the memory cell inside of the flash memory with the result that the chip size is enlarged and a cost thereof is increased. However, when an attempt is made to directly control the memory cell from the outside, an outside wiring load is increased.

Furthermore, conventionally, a large number of detachable memory devices are provided which use a flash memory. For example, a smart medium, a compact flash, a memory stick, an SD card or the like is provided. An interface of the smart medium is the interface itself of a NAND flash memory. Other devices are similar to the interface of a magnetic storage device. In any way, like the magnetic memory device, file data and a logical address are received and memorized under the file control on the host side. A file control system is required on the host side.

In this manner, the conventional memory device using the flash memory is controlled under the file control on the host side, so that the performance thereof is deteriorated. For example, when the minimum rewriting unit of the flash memory is larger than the minimum unit of the file control on the host side, it is required to rewrite even the file data which is not required to be rewritten inside of the flash memory at the time of rewriting one piece of file data. However, when an attempt is made to conduct the file control on the side of the flash memory system, there arises a problem as to how the interface is dealt with.

BRIEF SUMMARY OF THE INVENTION

A semiconductor integrated circuit device according to an embodiment of the present invention comprises: a first semiconductor substrate, in which, a memory cell array including a plurality of nonvolatile semiconductor memory cells, a plurality of bit lines electrically connected to the memory cell array, a plurality of word lines electrically connected to the memory cell array, a plurality of input terminals, and a plurality of transfer gate transistors each having one end electrically connected to a corresponding one of the word lines and another end electrically connected to a corresponding one of the input terminals, are provided; and a second semiconductor substrate, in which, a plurality of output terminals electrically connected to the input terminals of the first semiconductor substrate, and a word line control circuit configured to control the word lines and electrically connected to the output terminals, are provided.

A nonvolatile semiconductor memory device according to an embodiment of the present invention comprises: a first semiconductor substrate, in which, a memory having a memory cell array including a plurality of nonvolatile semiconductor memory cells, is provided; and a second semiconductor substrate, in which, a control portion configured to control the memory, a network interface connectable to a network, a file management portion connected to the network interface configured to manage a relation between a data file given from the network and an address of the memory cell array, and a memory interface connected to the file management portion configured to convert a signal given from the network to a signal which is capable of being used at the control portion, are provided.

BRIEF DESCRIPTION OF THE SEVERAL VIEWS OF THE DRAWING

FIGS. 12, 13, 14, 15 and 16 are a circuit diagram showing one example of a signal conversion circuit 31, respectively.

FIG. 21 is a circuit diagram showing one example of the data circuit 27, the bit line circuit 28 and the bit line BL.

FIG. 22 is a circuit diagram showing another example of the signal conversion circuit 31.

FIG. 23 is a circuit diagram showing one example of the source line circuit 29 and the well circuit 30.

FIG. 25A is a view showing another example of an inside of the package 1 shown in FIG. 1.

FIG. 25B is a view showing another example of the stacked chip structure.

FIG. 28 is a view showing one example of another relation between the network and the nonvolatile memory device shown in FIG. 26.

DETAILED DESCRIPTION OF THE INVENTION

Figure 1:
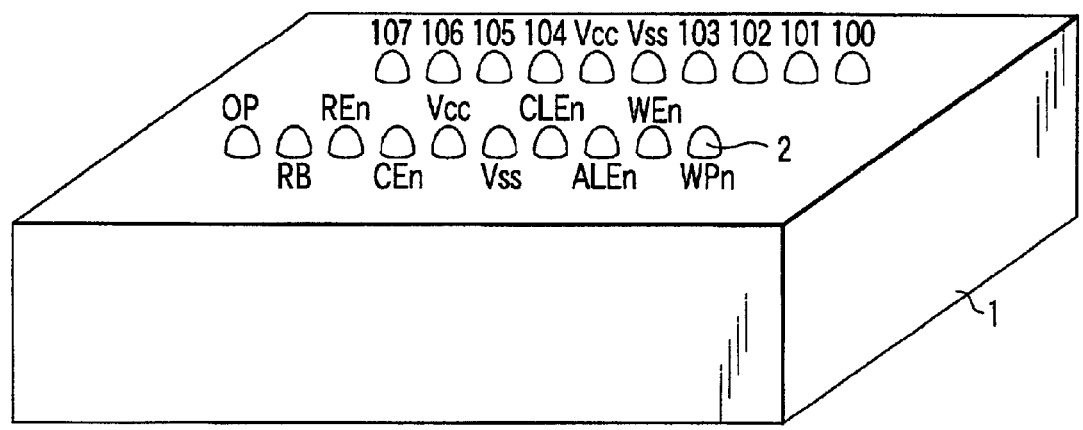
FIG. 1 is a view showing one example of a package of a nonvolatile semiconductor memory device according to a first embodiment of the present invention.

Hereinafter, embodiments of the present invention will be explained by referring to the drawings. In this explanation, common portions are denoted by common reference numerals over the whole drawings.

(First Embodiment)

FIG. 1 is a view showing one example of a package of a nonvolatile semiconductor memory device according to a first embodiment of the present invention.

As shown in FIG. 1, signal terminals 2 are provided on a surface of a package 1.

Figure 2:
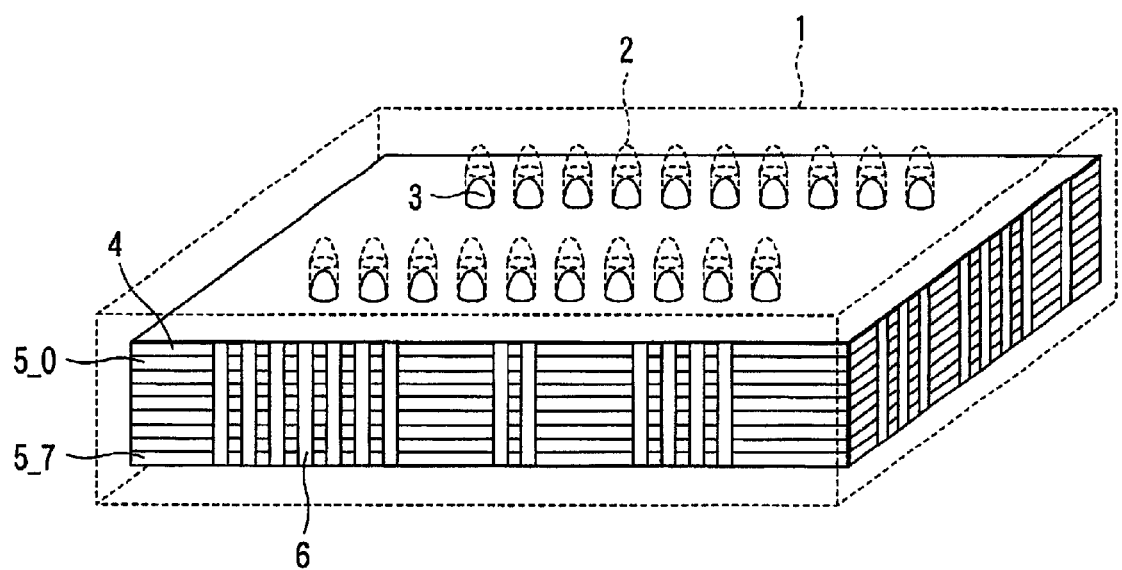
FIG. 2 is a view showing one example of an inside of the package 1 shown in FIG. 1.

FIG. 2 is a view showing one example of an inside of the package 1 shown in FIG. 1.

As shown in FIG. 2, inside of the package 1, a package 4 and eight packages 5-0 to 5-7 are provided. The packages 4 and 5-0 to 5-7 each sealed a semiconductor substrate. The package 4 is stacked on the package 5-0. The package 5-0 is stacked on the package 5-1. The package 5-1 is stacked on the package 5-2. The package 5-6 is stacked on the package 5-7. On the side surfaces of the respective packages 4, 5-0 to 5-7, wirings 6 are provided for mutually connecting terminals provided on the respective packages.

On the rear surface of the lamination layer of the package 4, another terminals 3 are further provided to be connected to the signal terminals 2 provided on the package 1.

Figure 3:
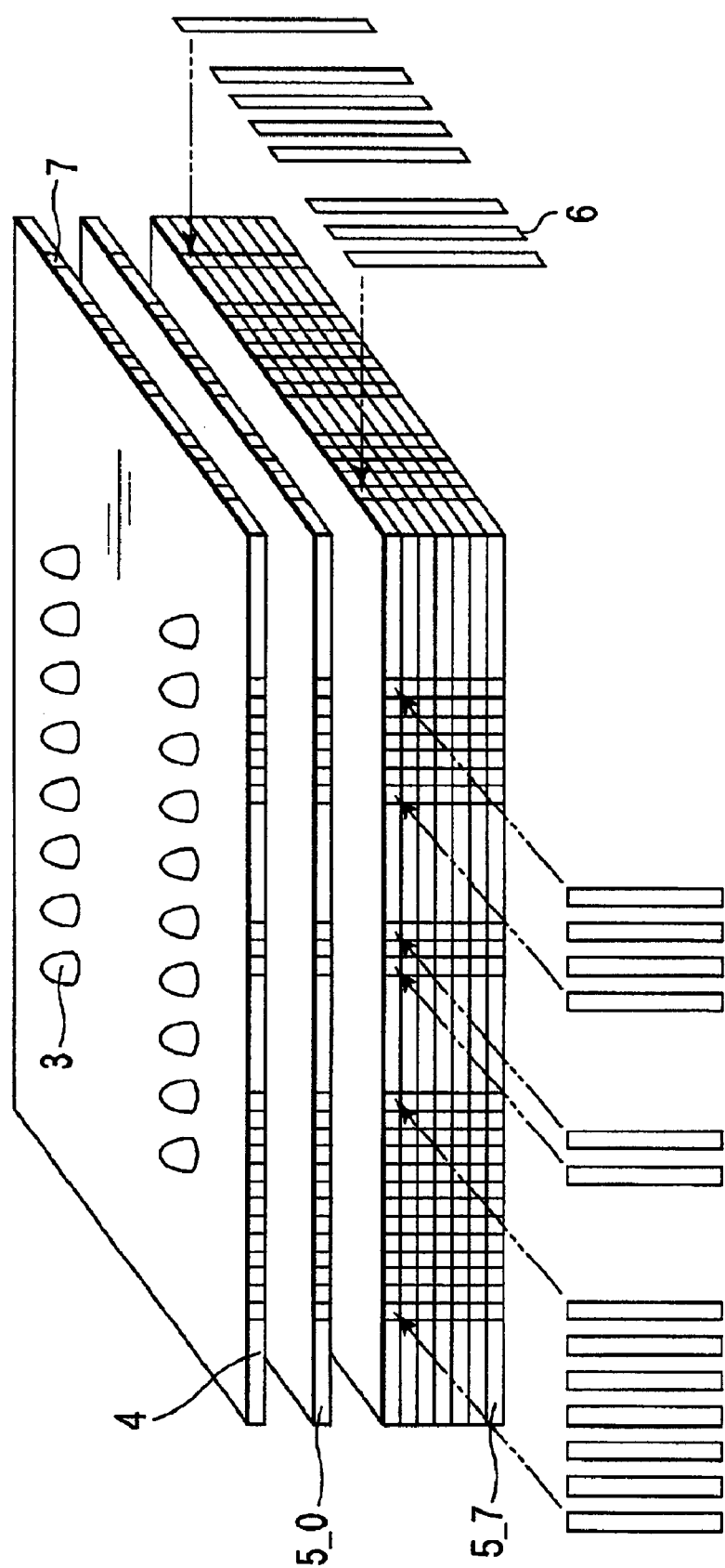
FIG. 3 is a view showing one example of a stacked chip structure inside of the package 1 shown in FIG. 1.

FIG. 3 is a view showing one example of a stacked chip structure inside of the package 1 shown in FIG. 1.

As shown in FIG. 3, terminals 7 are provided on respective side surfaces of the packages 4, 5-0 to 5-7 and the respective terminals 7 are mutually connected with the wirings 6.

Figure 4:
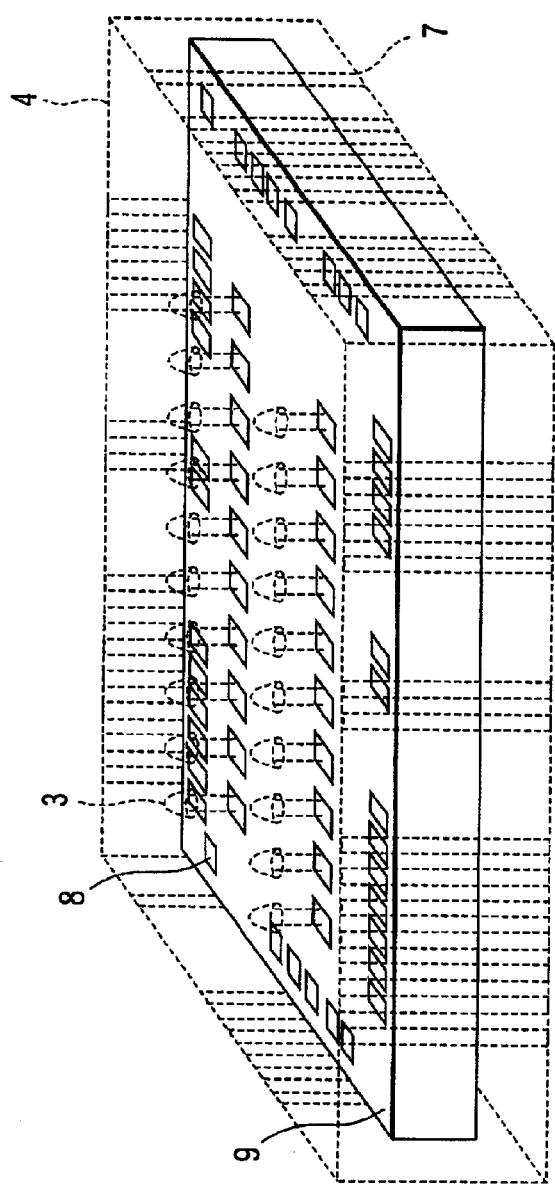
FIG. 4 is a view showing one example of an inside of a package 4 shown in FIGS. 2 and 3.

FIG. 4 is a view showing one example of an inside of the package 4 shown in FIGS. 2 and 3.

As shown in FIG. 4, a semiconductor substrate 9 is sealed inside of the package 4. Terminals 8 are provided on the surface of the substrate 9 the terminals to be connected to the terminals 3 and the terminals 7.

Figure 5:
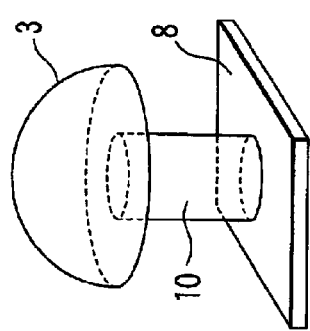
FIG. 5 is a view showing one example of a connection structure between the terminal 8 and the terminal 3 shown in FIG. 4.

FIG. 5 is a view showing one example of a connection structure with the terminal 8 and the terminal 3 shown in FIG. 4.

As shown in FIG. 5, the terminal 8 provided on the surface of the semiconductor substrate 9 is connected to the terminal 3 formed on the rear surface of the lamination layer of the package 4 with a wiring material 10 filled into a hole formed on the package 4.

Figure 6:
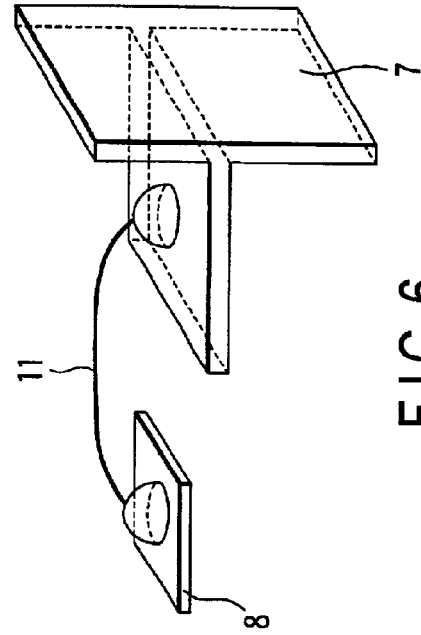
FIG. 6 is a view showing one example of a connection structure between the terminal 8 and the terminal 7 shown in FIG. 4.

FIG. 6 is a view showing one example of a connection structure of the terminal 8 and the terminal 7 shown in FIG. 4.

As shown in FIG. 6, the terminal 8 provided on the surface of the substrate 9 is connected to the terminal 7 formed on the side surface of the package 4 with a bonding wire 11.

Figure 7:
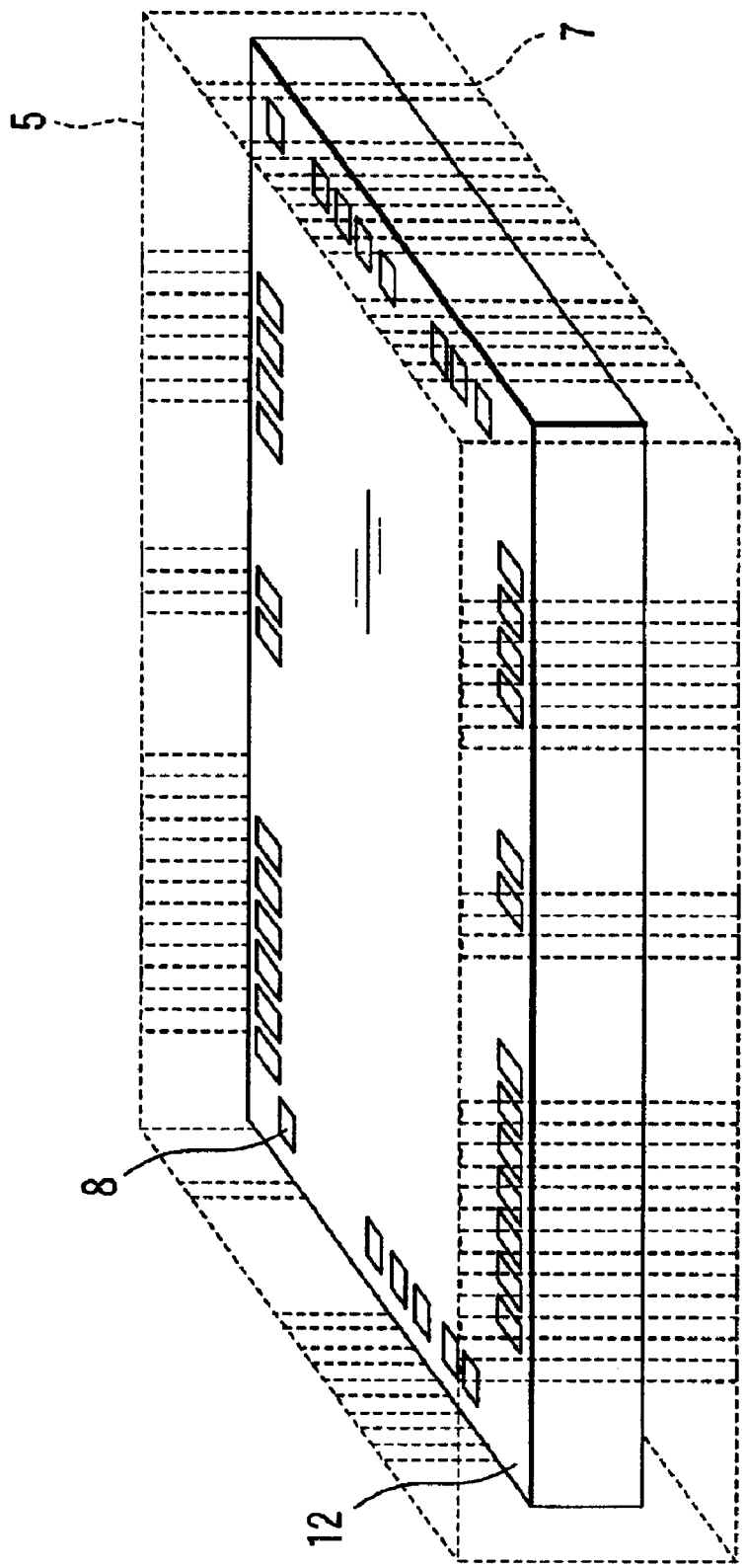
FIG. 7 is a view showing one example of an inside of the package 5 shown in FIGS. 2 and 3.

FIG. 7 is a view showing one example of an inside of the package 5 shown in FIGS. 2 and 3.

As shown in FIG. 7, a semiconductor substrate 12 is sealed inside of the package 5. Terminals 8 are provided on the surface of the substrate 12 to be connected to the terminals 7 with the connection structure shown in FIG. 6. A nonvolatile semiconductor memory cell array is formed in the substrate 12 as explained later.

Figure 8:
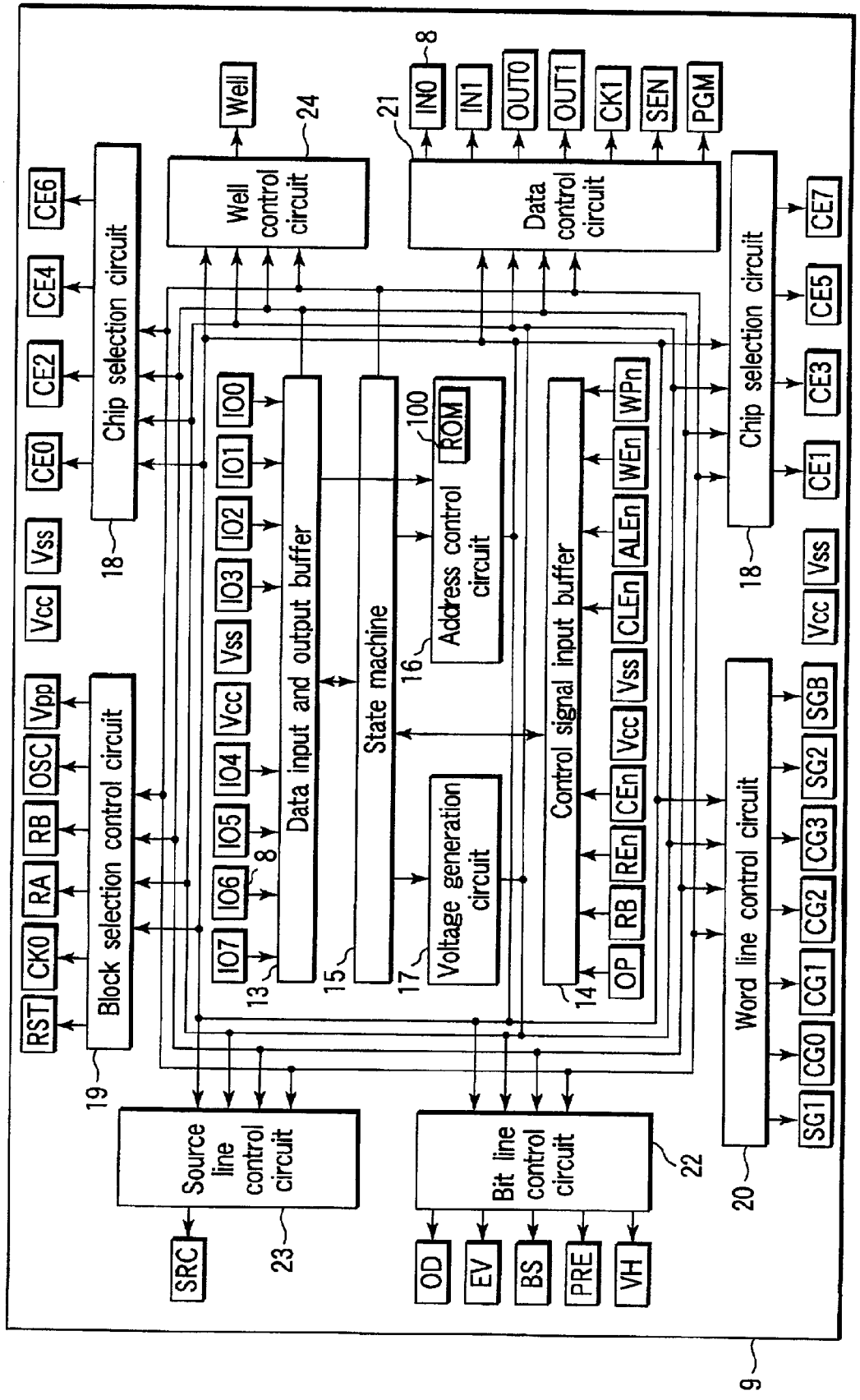
FIG. 8 is a block diagram showing one example of circuits formed in the semiconductor substrate 9 inside of the package 4.

FIG. 8 is a block diagram showing one example of circuits formed in the semiconductor substrate 9 inside of the package 4.

As one example of the terminals 8 to be connected to the terminals 3, OP, RB, REn, CEn, Vcc, Vss, CLEn, ALEn, WEn, WPn, and IO0 to IO7 terminals are shown in FIG. 8. Symbol Vcc denotes a power source terminal, and symbol Vss denotes a ground terminal. Input and output terminals IO0 to IO7 are terminals for the input and output of written and read data, and for the input of command data and address data. The terminals IO0 to IO7 are connected, for example, to a data input and output buffer 13. OP, RB, REn, CEn, CLEn, ALEn, WEn, and WPn terminals are terminals for the input of control signals OP, RB, REn, CEn, CLEn, ALEn, WEn, and WPn and are connected, for example, to a control input buffer 14. The Signals of the terminals 3 function as terminals as seen, for example, in the NAND flash memory TC58V32AF (manufactured by Toshiba Corporation).

A state machine 15 is a circuit for generating a basically control signal for controlling the circuits in the package 5 in accordance with a control signal, a command and an address input from the outside.

The state machine 15 shown in FIG. 8 which controls, as one example, an address control circuit 16, a voltage generation circuit 17, a chip selection circuit 18, a block selection control circuit 19, a word line control circuit 20, a data control circuit 21, a bit line control circuit 22, a source line control circuit 23, and a well control circuit 24. The address control circuit 16 manages an address at the time of an access to the memory cell array inside of the package 5. The voltage generation circuit 17 generates a voltage required for the reading, writing and erasing of data from the memory cell array inside of the package 5. The chip selection circuit 18 selects the package 5, for example, any of the packages 5-0 through 5-7. The block selection control circuit 19 selects a memory block of the memory cell array inside of the package 5. The word line control circuit 20 controls word lines connected to the memory cell array inside of the package 5. The data control circuit 21 controls the input and output of the data with the memory cell array inside of the package 5. The bit line control circuit 22 controls bit lines connected to the memory cell array inside of the package 5. The source line control circuit 23 controls source lines connected to the memory cell array inside of the package 5. The well control circuit 24 controls a semiconductor layer (well) in which the memory cell array inside of the package 5 is formed.

Furthermore, as one example of the terminals 8 to be connected to the terminals 7, SG1, CG0, CG1, CG2, CG3, SG2, SGB, Vcc, Vss, CE0, CE1, CE2, CE3, CE4, CE5, CE6, CE7, PGM, SEN, CK0, CK1, OUT0, OUT1, IN0, IN1, Well, Vpp, OSC, RA, RB, RST, SRC, OD, EV, BS, PRE, and VH terminals are shown in FIG. 8.

A ROM 100 stores an address of a defect memory cell of the memory cell array inside of the package 5. The address control circuit 16 refers to data of the ROM 100 so that the defect memory cell is not used.

Figure 9:
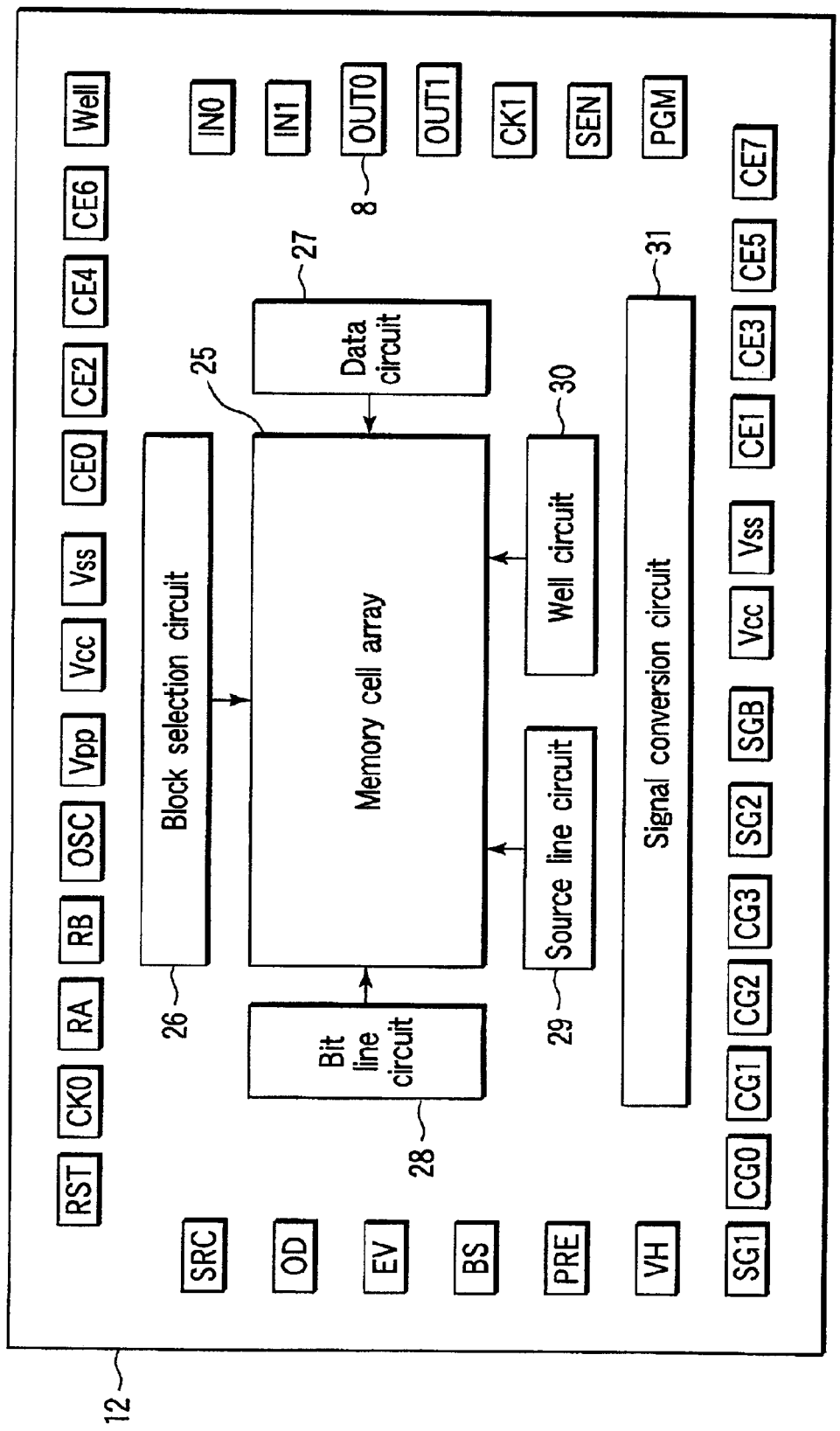
FIG. 9 is a block diagram showing one example of circuits formed in a semiconductor substrate 12 inside of the package 5.

FIG. 9 is a block diagram showing one example of circuits formed in the semiconductor substrate 12 inside of the package 5.

As shown in FIG. 9, a nonvolatile semiconductor memory device, for example, a flash memory is formed in the substrate 12 inside of the package 5. Furthermore, as one example of the terminals 8 to be connected to the terminals 7, SG1, CG0, CG1, CG2, CG3, SGB2, SGB, Vcc, Vss, CE0, CE1, CE2, CE3, CE4, CES, CE6, CE7, PGM, SEN, CK0, CK1, OUT0, OUT1, IN0, IN1, Well, Vpp, OSC, RB, RA, RB, RST, SRC, OD, EV, BS, PRE, and VH terminals are shown in FIG. 9. These terminals 8 are connected to the terminals 8 having the same name inside of the package 4 via the wiring 6.

As one example, a memory cell array 25, a block selection circuit 26, a data circuit 27, a bit line circuit 28, a source line circuit 29, a well circuit 30, and a signal conversion circuit 31 are provided in the substrate 12. The nonvolatile semiconductor memory cell is arranged in the memory cell array 25, for example, in a matrix-like configuration. The block selection circuit 26 selects a memory block of the memory cell array 25. The data circuit 27 controls the input and output of the data with the selected memory cell. The bit line circuit 28 controls a voltage of the bit line connected to the memory cell array 25. The source line control circuit 29 controls the source line connected to the memory cell array 25. The well circuit 30 controls a well in which the memory cell array 25 is formed. The signal conversion circuit 31 converts a signal of the terminal 8 and an inside signal.

Figure 10:
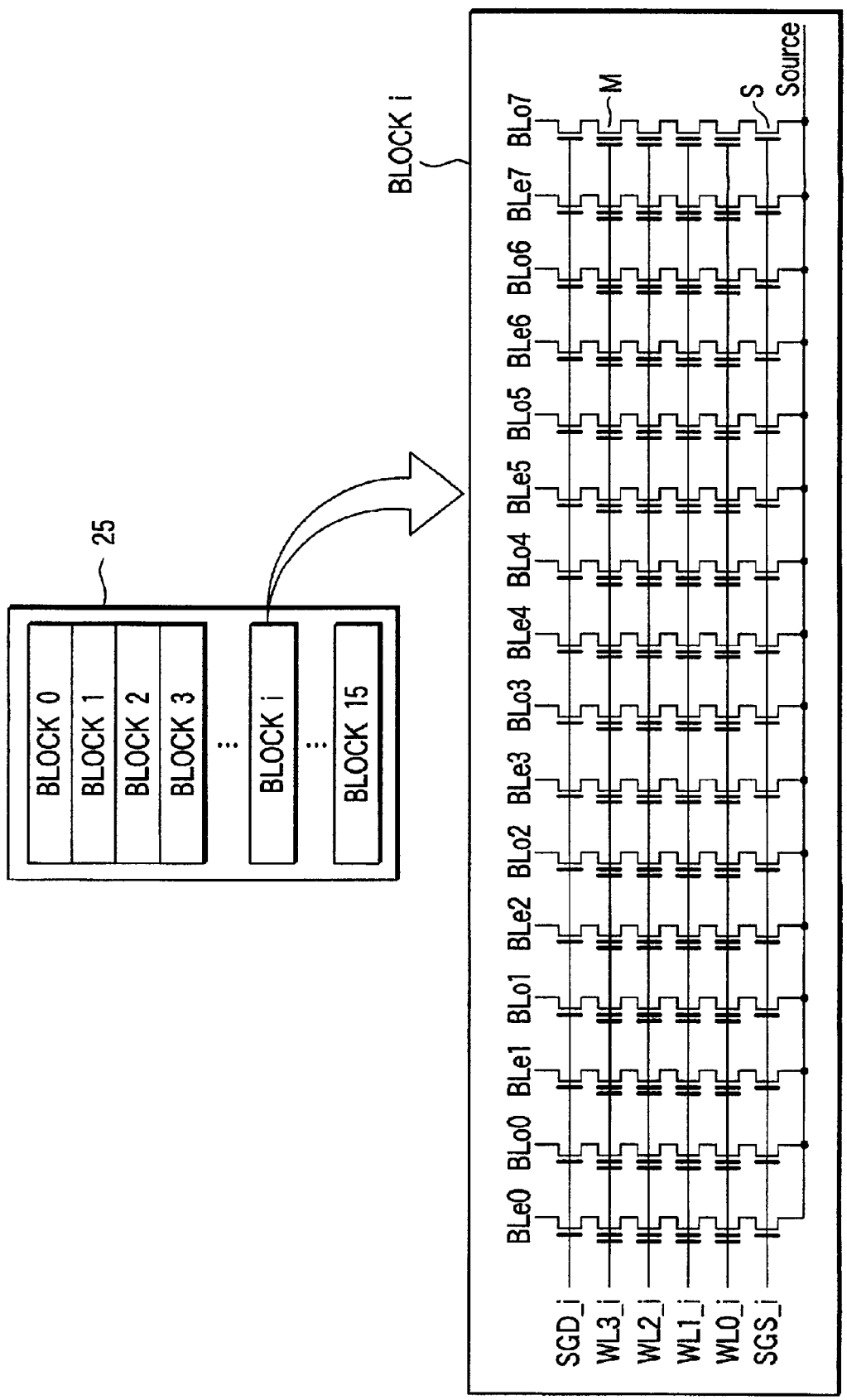
FIG. 10 is a view showing one example of the memory cell array 25 shown in FIG. 9.

FIG. 10 is a view showing one example of the memory cell array 25 shown in FIG. 9.

As shown in FIG. 10, the memory cell array 25 is divided into, for example, sixteen memory blocks BLOCK0 to BLOCK15. Each of the memory blocks BLOCKi (i=0 to 15) is provided with four word lines WL0-i to WL3-i and two select gate line SGD-i and SGD-i.

Four memory cells M and two select transistors S are connected to each other in series to constitute a NAND type memory cell unit. One end of the NAND type memory cell unit is connected to bit lines BLe0 to BLe7, and BLo0 to BLo7 while the other end thereof is commonly connected to a source line Source. Here, for simplification, the number of memory cells is decreased. However, when one word line comprises 4224 memory cells or more (528 bytes or more), one block comprises 16 word lines, and one memory cell array comprises 512 blocks or more, a memory cell array comparable to the NAND flash memory TC58V32AFT can be provided.

Figure 11A:
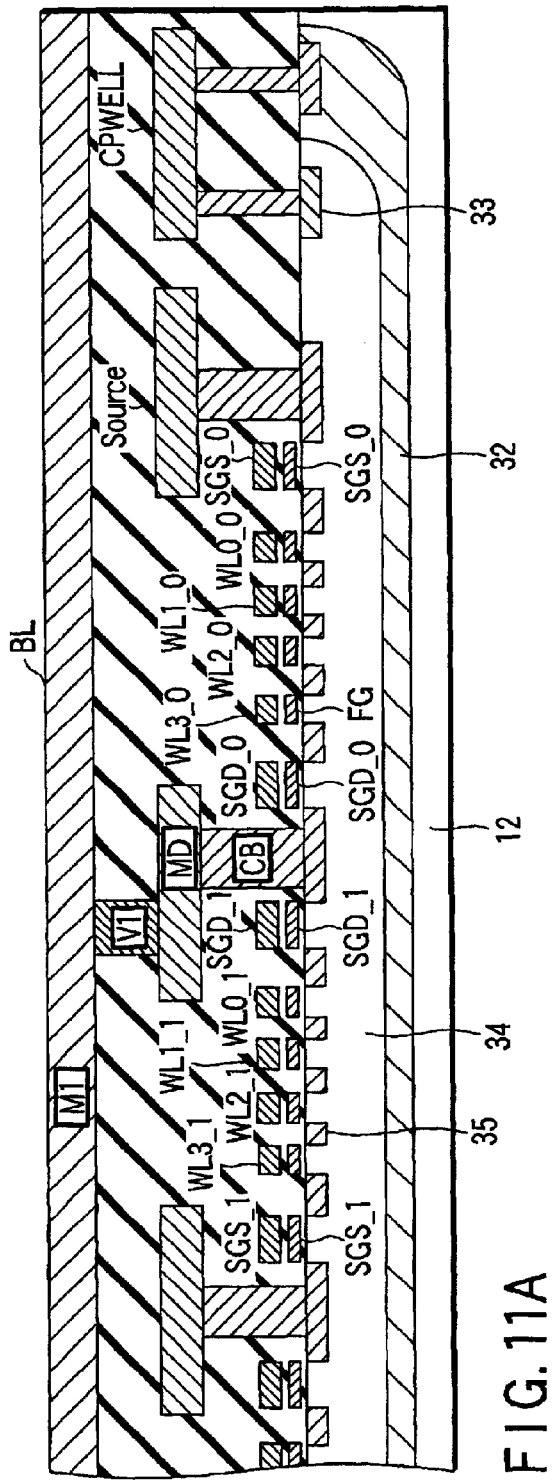
FIG. 11A is a sectional view showing a cross section taken along the bit line BL of the memory cell M shown in FIG. 10.
Figure 11C:
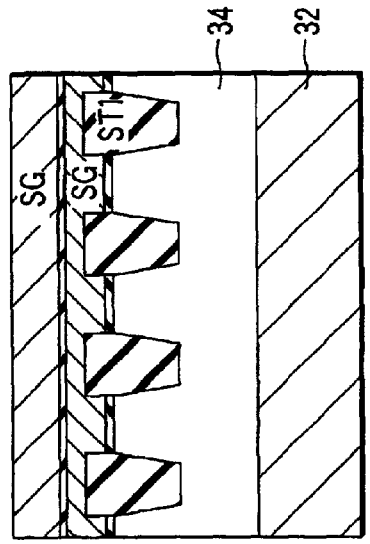
FIG. 11C is a sectional view taken along the select gate line SG of the select transistor S shown in FIG. 10.
Figure 11B:
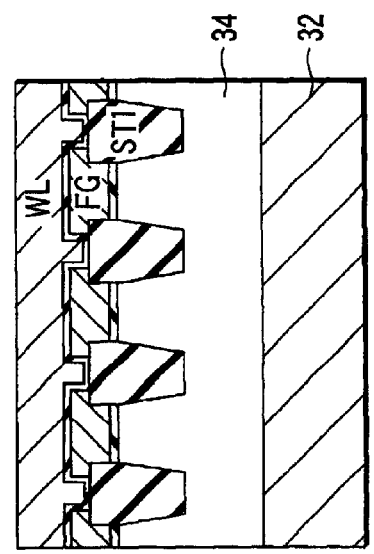
FIG. 11B is a sectional view showing a cross sectional taken along the word line WL of the memory cell M.

FIGS. 11A, 11B, and 11C are views showing one example of a structure of a memory cell M, respectively. FIG. 11A is a sectional view showing a cross section taken along the bit line BL of the memory cell M shown in FIG. 10. FIG. 11B is a sectional view showing a cross sectional taken along the word line WL of the memory cell M. FIG. 11C is a sectional view taken along the select gate line SG of the select transistor S shown in FIG. 10.

As shown in FIG. 11A, there is shown a view showing a structure of the memory cell M. An n-type well 32 is formed in a p-type semiconductor substrate 12, and a p-type well 34 is formed inside thereof. An n-type diffusion layer 35 and a p-type diffusion layer 33 are formed in the surface portion of the semiconductor substrate 12. A floating gate FG is stacked via the semiconductor substrate 12 and a tunnel oxide film and a control gate which forms a word line WL via an insulation film is stacked thereon. The bit line BL is formed of a second metal material and is connected to a first metal material M0 via a V1 contact. Furthermore, the bit line BL is connected to the n-type diffusion layer 35 which forms and end of a NAMD memory unit via the CB contact.

Furthermore, as shown in the cross sections of FIGS. 11B and 11C, each of the memory cells M id mutually isolated with s device isolation STI (shallow trench isolation) in a direction along the word line WL.

FIGS. 12 to 16 are circuit diagrams showing one example of a signal conversion circuit 31, respectively.

Figure 12:
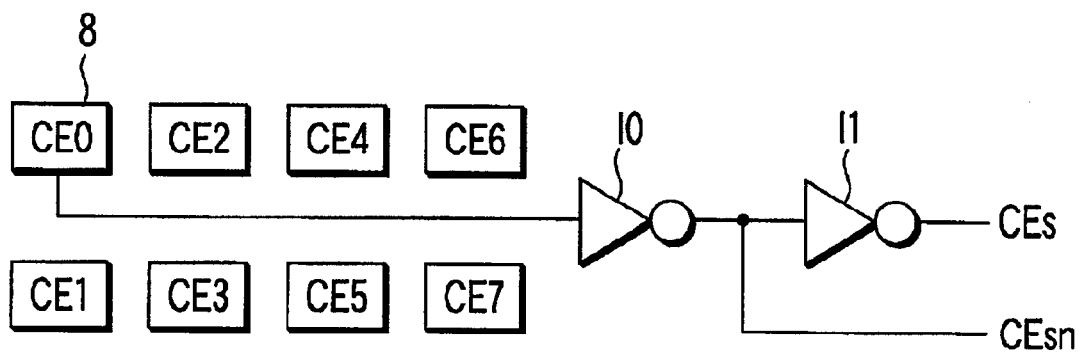

As shown in FIG. 12, one of the terminals CE0 to CE7 is input to the inverter 10 to be output as CEns. CEns are output as CEs via the inverter I1. Incidentally, in FIG. 12, CE0 is noted and shown. In the first embodiment, since there are provided eight packages 5, for example, and one of the terminals CE0 to CE7 is input to the inverter 10 to be output as CEns without being overlapped in each of the packages. With the chip selection signals CE0 to CE7, any one is selected out of the packages 5-0 to 5-7.

Figure 13:
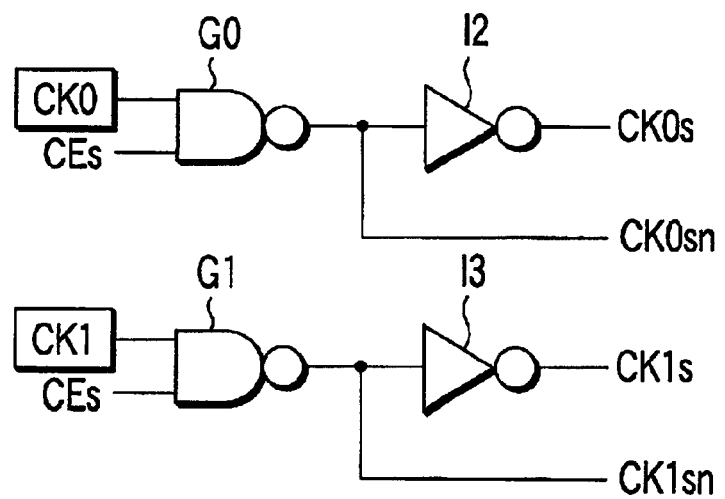

Signals CK0 and CK1 shown in FIG. 13 become effective when the chip selection signal CEs are set to "H" and are converted to CK0s, CK0sn, CK1s and CK1sn.

Signals RST, RA, RB, OSC, SEN, IN0, and IN1 shown in FIG. 14 become effective when the chip selection signal CEs is set to "H" and are converted to RSTs, RAs, RBs, OSCs, SENs, IN0s, and IN1s.

Figure 15:
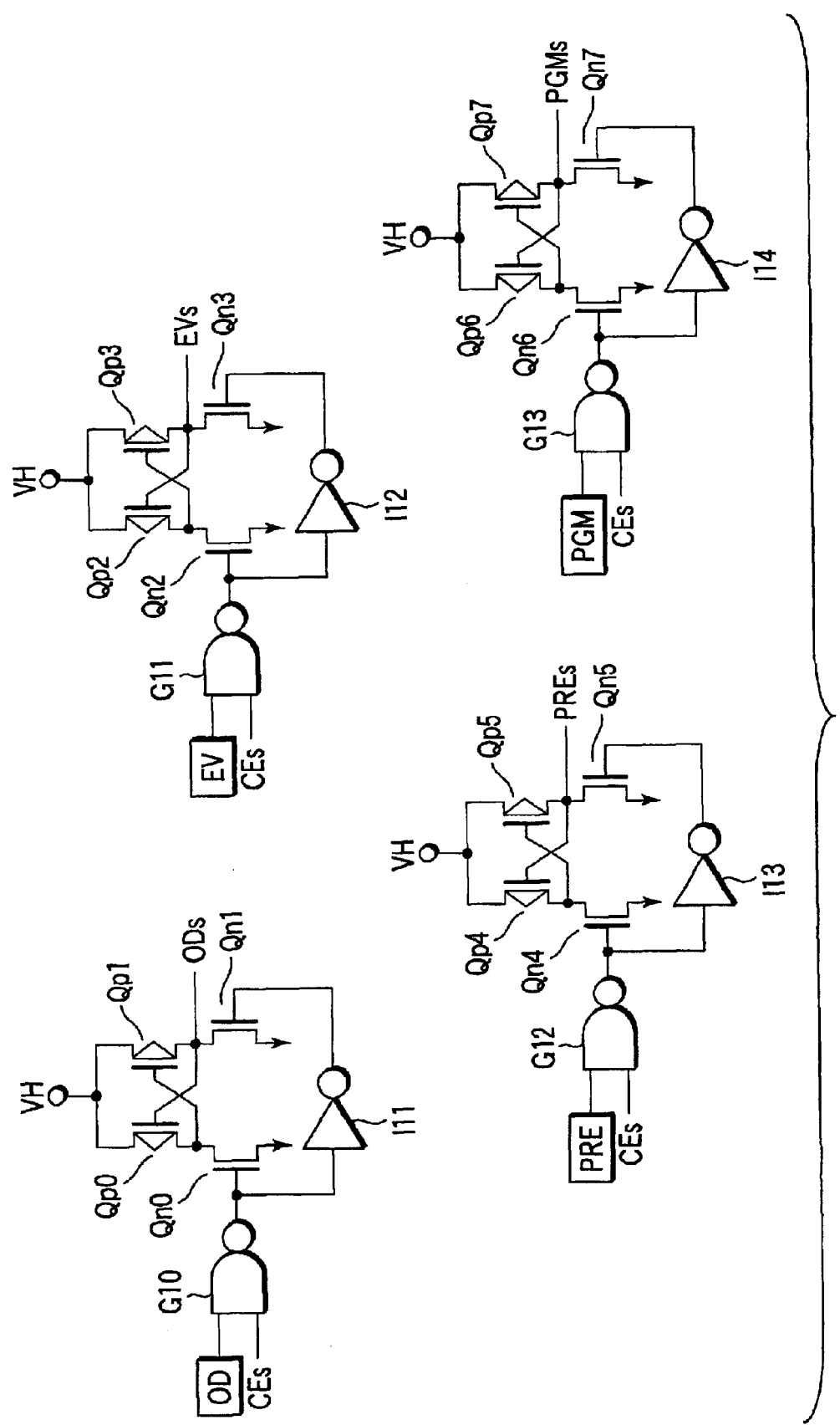

Signals OD, EV, PRE, and PGM shown in FIG. 15 become effective when the chip selection signal CEs is set to "H", and are converted to ODs, EVs, PREs, and PGMs with voltage amplitude of VH.

Figure 16:
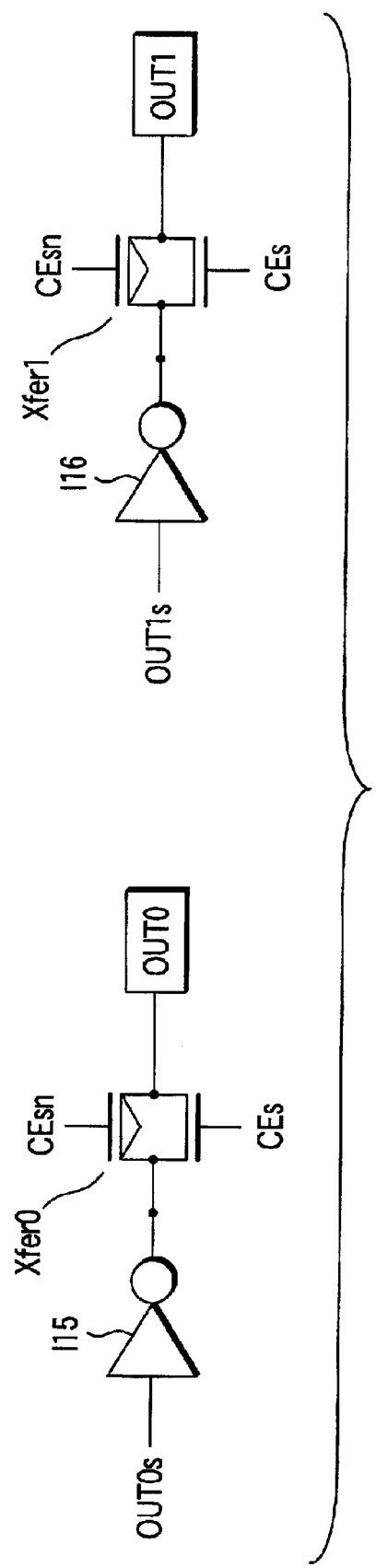
Figure 17:
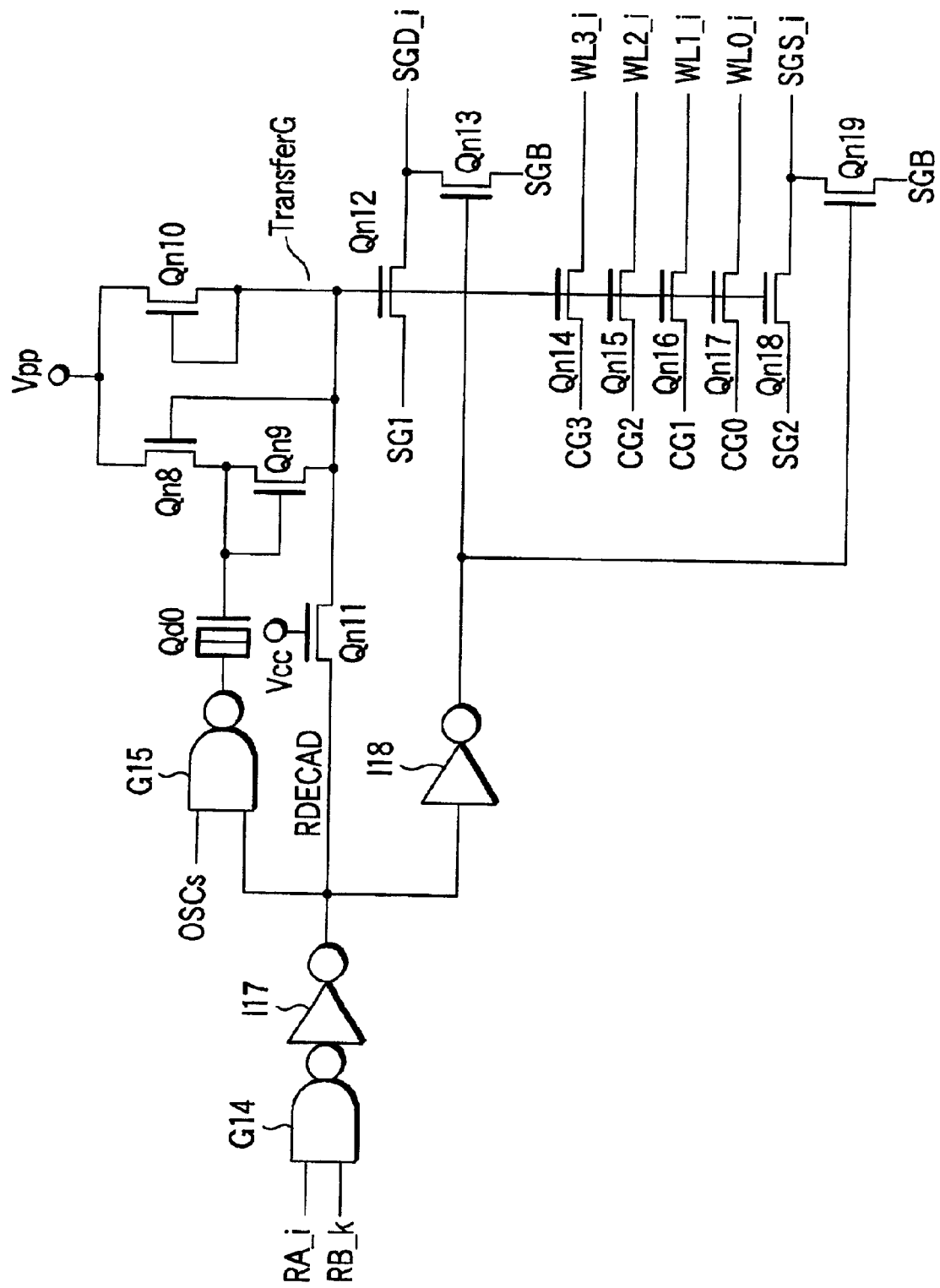
FIG. 17 is a circuit diagram showing one example of a circuit structure of the block selection circuit 26.

Internal signals OUT0s and OUT01s shown in FIG. 16 are output as OUT0 and OUT1 from the OUT0 and OUT1 terminals when the chip selection signal CEs is set to FIG. 17 is a circuit diagram showing one example of a circuit structure of the block selection circuit 26. The circuit shown in FIG. 17 is provided, for example, on each of the block.

As shown in FIG. 17, the word lines WL0-i to WL3-i and the select gate lines SGD-i and SGS-i of the BLOCKi are linked to the terminals CG0, CG1, CG2, CG3, SG1 and SG2 via an n-type MOS (NMOS) transistors Qn17, Qn16, Qn15, Qn14, Qn12, and Qn18, respectively.

Furthermore, the select gate lines SGD-i and SGS-i are connected to the terminal SGB via Qn13 and Qn19. In the selected block, a node TransferG is set to a voltage of about Vpp, and the word line and the select gate line are controlled with signals CG0, CG1, CG2, CG3, SG1 and SG2 from the package 4. In the unselected block, the TransferG is grounded, the word line is set to a floating state, and the select gate line is controlled with the SGB.

The block is selected with signals RA-j and RB-k, respectively. When the RA-j and RA-k are both set to "H", the block is selected. The signal OSCs is synchronized with an emit signal OSC generated in the package 4 to drive a pumping circuit comprising NMOS transistors Qn8, Qn9 and Qn10 and a depletion type NMOS transistor Qd0. As a consequence, Vpp is transferred to the TransferG. Correspondence between each of the blocks and the signal RA-j/RB-k is shown in Table 1.

TABLE 1

| BLOCK0 | RA-0 | RB-0 |
| --- | --- | --- |
| BLOCK1 | RA-1 | RB-0 |
| BLOCK2 | RA-2 | RB-0 |
| BLOCK3 | RA-3 | RB-0 |
| BLOCK4 | RA-0 | RB-1 |
| BLOCK5 | RA-1 | RB-1 |
| BLOCK6 | RA-2 | RB-1 |
| BLOCK7 | RA-3 | RB-1 |
| BLOCK8 | RA-0 | RB-2 |
| BLOCK9 | RA-1 | RB-2 |
| BLOCK10 | RA-2 | RB-2 |
| BLOCK11 | RA-3 | RB-2 |
| BLOCK12 | RA-0 | RB-3 |
| BLOCK13 | RA-1 | RB-3 |
| BLOCK14 | RA-2 | RB-3 |
| BLOCK15 | RA-3 | RB-3 |

Each voltage when the BLOCKi is selected is shown in Table 2.

TABLE 2

| | Erase | Write | Read | Write verify |
| --- | --- | --- | --- | --- |
| SGS-i | Vera | 0V | Vread | Vread |
| WL0-i | 0V | Vpass | Vread | Vread |
| WL1-i | 0V | Vpgm | Vcgr | Vcgv |
| WL2-i | 0V | Vpass | Vread | Vread |
| WL3-i | 0V | Vpass | Vread | Vread |
| SGD-i | Vera | Vcc | Vread | Vread |
| SGS-x(x≠i) | Vera | 0V | 0V | 0V |
| WL0-x(x≠i) | Vera | 0V | 0V | 0V |
| WL1-x(x≠i) | Vera | 0V | 0V | 0V |
| WL2-x(x≠i) | Vera | 0V | 0V | 0V |
| WL3-x(x≠i) | Vera | 0V | 0V | 0V |
| SGD-x(x≠i) | Vera | 0V | 0V | 0V |
| SGB | Vcc | 0V | 0V | 0V |
| SG2 | Vcc | 0V | Vread | Vread |
| CG0 | 0V | Vpass | Vread | Vread |
| CG1 | 0V | Vpgm | 0V | 0.5V |
| CG2 | 0V | Vpass | Vread | Vread |
| CG3 | 0V | Vpass | Vread | Vread |
| SG1 | Vcc | Vcc | Vread | Vread |
| BL (selected) (data "0") | — | 0V | Vcc | Vcc |
| BL (selected) (data "1") | — | Vcc | 0V | 0V |
| BL (unselected) | Vera | Vcc | 0V | 0V |
| BS | Vcc | Vcc | 0V | 0V |
| Source | Vera | 0V | 0V | 0V |
| SRC | Vera | 0V | 0V | 0V |
| CPWELL | Vera | 0V | 0V | 0V |
| Well | Vera | 0V | 0V | 0V |
| Vpp | Vcc | Vpgm | Vread | Vread |
| OSCs | Vcc | 0V/Vcc oscillate | 0V/Vcc oscillate | 0V/Vcc oscillate |

In Table 2, there is shown an example in which the word line WL1-i is selected in writing and reading.

A power source voltage Vcc is typically set to 3 V, an erasing voltage Vera is typically set to 20 V, a writing voltage Vpgm is typically set to 18 V, a writing auxiliary voltage Vpass is typically set to 10 V, a reading auxiliary voltage Vread is typically set to 3.5 V, a reading voltage Vcgr is typically set to 0 V, and a verify voltage Vcgv is typically set to 0.5 V. It is easy and possible to prepare a plurality of reading voltages and verify voltages for the multiplication of values.

Figure 18:
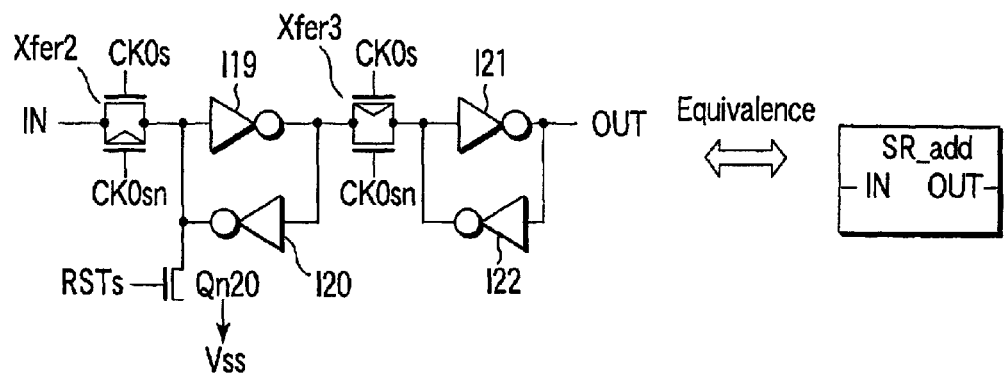
FIG. 18 is a circuit diagram partially showing one example of a shift register in the block selection circuit 26.

FIG. 18 is a circuit diagram partially showing one example of a shift register circuit in the block selection circuit. In particular, a portion of the shift register circuit for generating, in particular, signals RA-i and RB-k is shown.

As shown in FIG. 18, when the reset signal RSTs is set to "H", a shift register SR-add is reset. When the clock signal CK0s is set to "H", an input signal IN is received to latch the input signal when the signal CK0s is set to "L".

Figure 19:
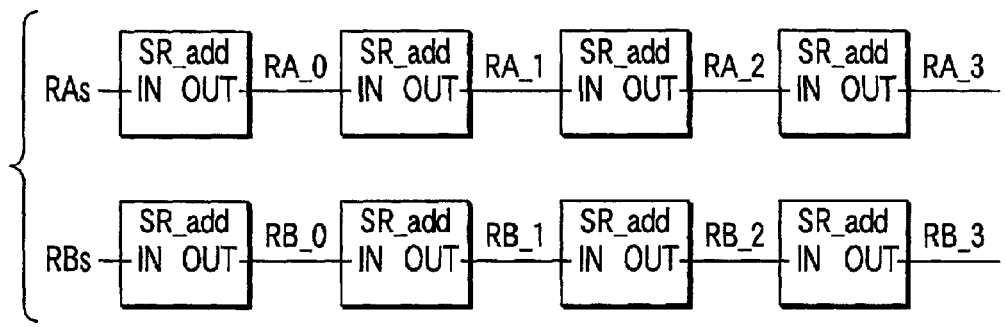
FIG. 19 is a circuit diagram showing one example of the shift register in the block selection circuit 26.

FIG. 19 is a circuit diagram holistically showing one example of the shift register circuit in the block selection circuit. In particular, the whole shift register circuit for generating the signals RA-i and RB-K is shown.

The shift register circuit shown in FIG. 19 is provided adjacent to the circuit shown in FIG. 17 to constitute the block selection circuit 26 together with the circuit shown in FIG. 17.

With the circuit shown in FIG. 19, it is possible to generate desired signals RA-I and RB-k by inputting address data signals RAs and RBs in synchronization with the clock signal CK0s. As a consequence, an arbitrary block can be selected.

Figure 20:
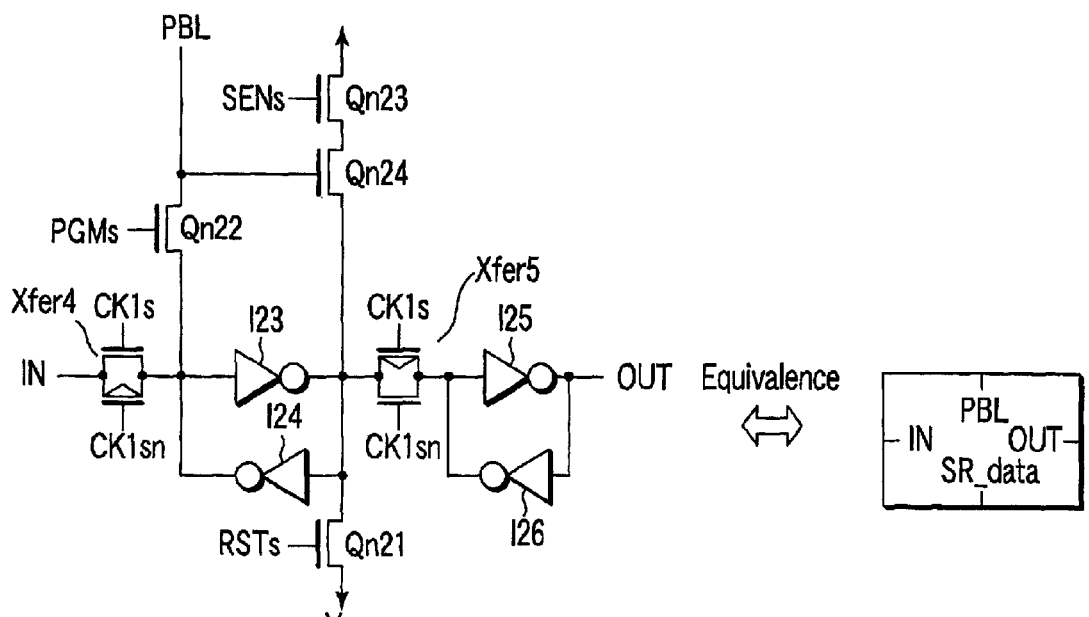
FIG. 20 is a circuit diagram showing one example of a shift register circuit in a data circuit 27.

FIG. 20 is a circuit diagram showing one example of a shift register circuit in a data circuit 27.

As shown in FIG. 20, when the reset signal RSTs is set to "H", the shift register SR-data is reset. When the clock signal CK1s is set to "H", the input signal IN is received to latch the input signal when the signal CK1s is set to "L". A node PBL is connected to the bit line BL. When the writing signal PGMs is set to "H", the latch circuit comprising inverters I23 and I24 and the bit line are linked to write data. At the reading and writing verify time, the voltage showing the data of the memory cell which appears in the bit line is such that a sense signal SENs is sensed at "H", and is latched to the latch circuit comprising the inverters I23 and I24.

FIG. 21 is a circuit diagram showing one example of the data circuit 27, the bit line circuit 28 and the bit line BL.

In the circuit shown in FIG. 21, the writing data signals IN0s and IN1s are input in synchronization with the clock signal CK1s, so that the desired writing data is set. Furthermore, the reading data signals OUT0s and OUT1s can be output in synchronization with the clock signal CK1s.

Either of the two bit lines BLe and BLo is selected with the bit line selection signals EVs and ODs. BLe is selected when the EVs is set to "H" and ODs is set to "L". BLo is selected when the EVs is set to "L" and the ODs is set to "H". The unselected bit line is connected to a BS terminal when a precharge signal PREs is set to "H" with the bit line circuit 28.

Furthermore, a potential of the selected bit line can be set in advance by using the bit line circuit 28. When the EVs is set "H" and ODs is set to "L", BLo is connected to BS by setting the precharge signal PREs to "H". When the EVs is set to "L" and the ODs is set to "H", BLe is connected to the BS by setting the precharge signal PREs to "H". After that, when both the EVs and ODs are set to "L", the bit line to be selected is precharged to the same potential as the BS. After this, data in the memory cell can be read by giving a potential to the word line.

Each voltage at which the BLOCKi is selected is shown in Table 2. In Table 2, as described above, there is shown an example in which the word line WL-i is selected in reading and writing.

FIG. 22 is a circuit diagram showing another example of the signal conversion circuit 31.

As shown in FIG. 22, an input protection element comprising a diode DO and a resistor RO may be connected to the terminal 8. FIG. 22 is a view showing an example of a chip selection signal CEO.

FIG. 23 is a circuit diagram showing one example of the source line circuit 29 and the well circuit 30.

In an example shown in FIG. 23, the source line circuit 29 and the well circuit 30 shares a portion of a circuit.

As shown in FIG. 23, the signal OSCs is synchronized with the oscillation signal generated in the package 4 to drive a pump circuit comprising NMOS transistors Qn31 and Qn32, a depletion type NMOS transistor Qd1. The chip selection signal CEsn is set to "L" so that the p-type well 34 is linked in which the terminal Well and the memory cell are formed. Furthermore, the terminal SRC and the source line Source area linked.

Each voltage at which the BLOCKi is selected is shown in Table 2. As described above, Table 2 shows an example in which the word line WL1-1 is selected in the writing and reading.

Figure 24:
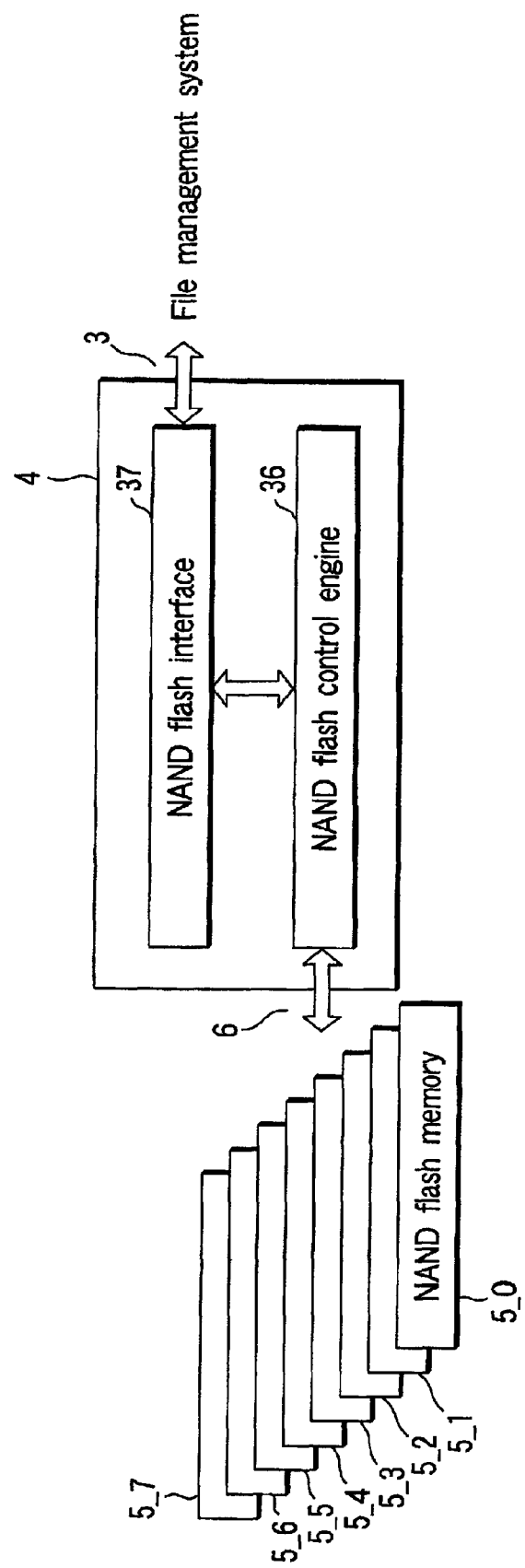
FIG. 24 is a system diagram showing one example of a system of the nonvolatile memory device according to the first embodiment of the present invention.

FIG. 24 is a system diagram showing one example of a system of the nonvolatile memory device according to the first embodiment of the present invention.

As shown in FIG. 24, one package is 4 controls a plurality of NAND flash memories 5 via the wiring 6. A control circuit can be eliminated from the individual NAND flash memory 5 by sharing the control circuit in this manner with the result that a NAND flash memory 5 having a small chip size can be created. For example, as a result of this, a cheap flash memory system as a whole can be obtained.

The inside of the package 4 can largely divided into two portions. A NAND flash interface 37 is a summary of the data input and output buffer 13, the control signal buffer 14 and the state machine 15 shown in FIG. 8. A residual portion shown in FIG. 8 is a NAND flash control engine 36.

The package 4 is controlled under the file control system such as a computer or the like via the terminal 3.

In this manner, the nonvolatile semiconductor memory device or nonvolatile semiconductor memory system according to the first embodiment of the present invention includes, for example, a first semiconductor substrate and a second semiconductor substrate. For example, on the first semiconductor substrate, a memory cell array including a plurality of nonvolatile semiconductor memory cells, a plurality of bit lines electrically connected to the memory cell array, a plurality of word lines electrically connected to the memory cell array, a plurality of input terminals, and a plurality of transfer gate transistors having each of one ends connected to the plurality of word lines and having each of the other ends connected to the plurality of input terminals are provided. For example, on the second semiconductor substrate, a plurality of output terminals electrically connected to the plurality of input terminals, and a word line control circuit electrically connected to the plurality of output terminals for controlling a plurality of word lines are provided.

Furthermore, the nonvolatile semiconductor memory device or nonvolatile semiconductor memory system according to the first embodiment of the present invention includes, for example, the first semi-conductor substrate and the second semiconductor substrate. For example, on the first semiconductor substrate, a memory cell array including a plurality of nonvolatile semiconductor memory cells, a plurality of bit lines electrically connected to the memory cell array, a plurality of word lines electrically connected to the memory cell array, a plurality of input terminals, and a plurality of transfer gate transistors having each of one ends electrically connected to the plurality of word lines and having each of the other ends electrically connected to the plurality of input terminals are provided. For example, on the second semiconductor substrate, a plurality of output terminals electrically connected to a plurality of input terminals, a word line control circuit electrically connected to the plurality of output terminals for controlling the plurality of word lines, an interface circuit, and a plurality of interface terminals electrically connected to the interface circuit are provided.

Furthermore, the nonvolatile semiconductor memory device or nonvolatile semiconductor memory system according to the first embodiment of the present invention includes, for example, a first semiconductor substrate, and a second semiconductor substrate. For example, on the first semiconductor substrate, a memory cell array including a plurality of nonvolatile semiconductor memory cells, a plurality of bit lines electrically connected to the memory cell array, a first shift register for controlling the plurality of bit lines, a plurality of word lines electrically connected to the memory cell array, a plurality of input terminals, a plurality of transfer gate transistors having each of one ends electrically connected to the plurality of word lines and having each of the other ends electrically connected respectively to the plurality of input terminals and a second shift register for controlling the plurality of transfer gate transistors are provided. For example, on the second semiconductor substrate, a plurality of output terminals electrically connected to the plurality of input terminals, and a word line control circuit electrically connected to the plurality of output terminals for controlling the plurality of word lines are provided.

Furthermore, as another configuration of the nonvolatile semiconductor memory device or nonvolatile semiconductor memory device system according to the first embodiment, the following can be given.

(1) The first semiconductor substrate and the second semiconductor substrate are stacked on each other.

(2) The first semiconductor substrates are provided in plurality and the first semiconductor substrates and the second semiconductor substrate are stacked on each other.

FIGS. 25A and 25B show such a modification of the nonvolatile semiconductor memory or memory system.

As FIG. 25A shows, a semiconductor substrate 9 is laid on a stack of eight semiconductor substrates 12-0 to 12-7. This structure is different from the first embodiment in which the package 4 is stacked on the one of the packages 5.

The first embodiment may comprise only one package 5. Similarly, the modification shown in FIG. 25A may comprise only one semiconductor substrate 12. In this case, the semiconductor substrate 9 and the semiconductor substrate 12 are combined, in back-to-back position as is illustrated in FIG. 25B. Similarly, the package 4 and the package 5 are combined, in back-to-back position, in the first embodiment.

As has been described above, in the nonvolatile semiconductor memory device or nonvolatile semiconductor memory system according to the first embodiment of the present invention, a large number of control circuits can be eliminated from a plurality of flash memory chips. Then, a cheap flash memory system can be obtained by sharing the control circuit in a single or a plurality of flash memory chips. Furthermore, for example, when packaged or wired as shown in FIG. 2, the flash memory system can be used as one flash memory device.

Furthermore, the nonvolatile semiconductor memory device or nonvolatile semiconductor memory system according to the first embodiment of the present invention can be modified in various ways with the example shown in another form of the embodiment being set as a representative example.

(Second Embodiment)

Figure 26:
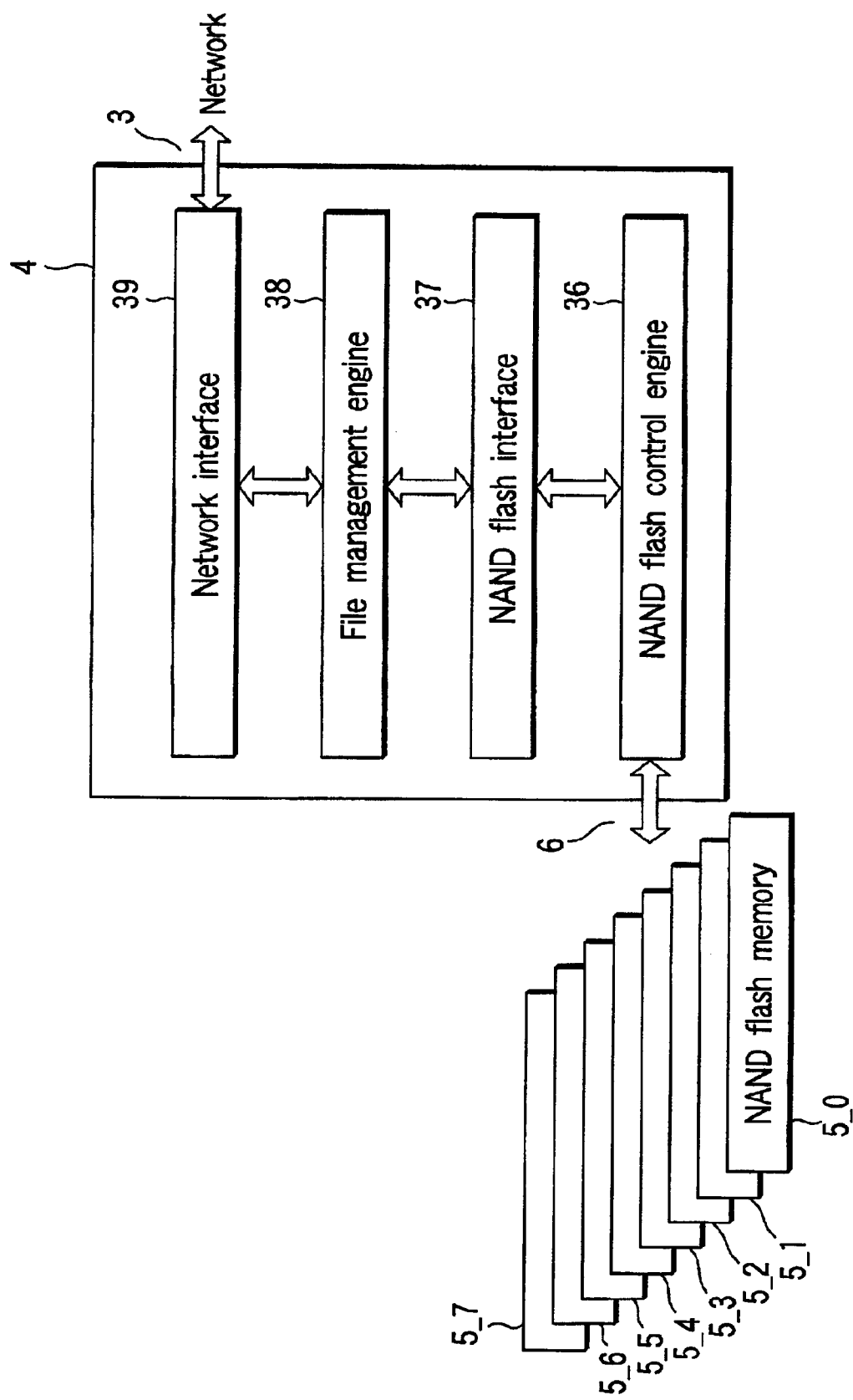
FIG. 26 is a system diagram showing one example of a nonvolatile semiconductor memory device system according to a second embodiment of the present invention.

FIG. 26 is a system view showing a nonvolatile semiconductor memory device system according to a second embodiment of the present invention.

As shown in FIG. 26, inside of the package 4, there are provided a file management engine 38 for managing a relation of a data file and an address of the memory cell array 25 and a network interface 39 corresponding to a network protocol as an interface with the outside. The package 4 can be directly linked to the network such as the internet or the like via the terminal 3 or the like.

For example, the network interface 39 corresponds to the TCP/IP (transmission control protocol/internet protocol) which is a main stream in the internet. Furthermore, for example, the network interface 39 corresponding, for example, to the TCP/IP can be connected with the ftp (file transfer protocol). As a consequence, the nonvolatile semiconductor memory device according to the present invention can be linked to the network as an FTP site. Furthermore, the network interface 39 is made linkable with an anonymous ftp (file transfer protocol) so that the network interface 39 can be connected more simply to the network. The network interface 39 can be also connected with the PPP (point-to-point protocol). Thus, the nonvolatile semiconductor memory device or nonvolatile semiconductor memory device system according to the second embodiment of the present invention is convenient in that the device or the system can be linked to the network via a telephone circuit.

Figure 27:
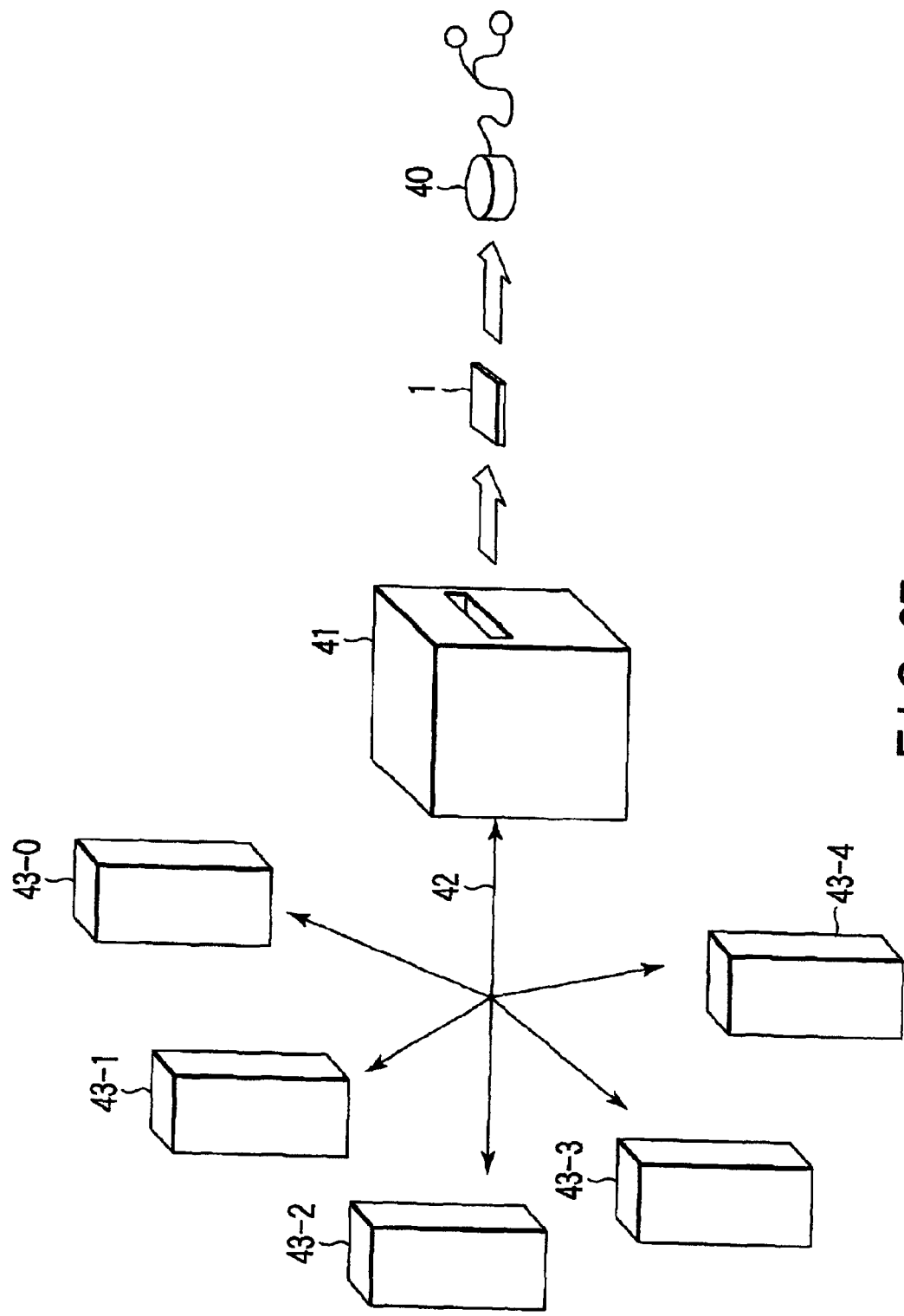
FIG. 27 is a view showing one example of a relation between the network and the nonvolatile memory device shown in FIG. 26.

FIG. 27 is a view showing a relation between the network and the nonvolatile semiconductor memory device shown in FIG. 26 network is sealed in the package 1.

As shown in FIG. 27, the data servers 43-0 through 43-4 and a software download machine 41 are linked via a TCP/IP protocol network 42. Software (for example, music source) required for the package 1 inserted into the software download machine 41 is held with the network 42 by using the FTP. The package 1 is pulled out from the software download machine 41 so that music or the like can be enjoyed with a portable music player 40, or the like.

FIG. 28 is a view showing another relation between the network and the nonvolatile semiconductor memory device shown in FIG. 26 which is sealed in the package 1.

As shown in FIG. 28, a data server 46 corresponding to the TCP/IP protocol and a telephone 44 are linked via a telephone circuit 45. Software (for example, music source) required for the package 1 inserted into the package 1 inserted into the telephone 44 is held from the data server 46 by using the PPP. The package 1 is pulled out from the telephone so that music or the like can be enjoyed with the portable music player 40 or the like.

Furthermore, it is possible to connect the single body to the network by adding a power source unit (battery or the like) and an input device to the package 1.

In this manner, the nonvolatile semiconductor memory device or nonvolatile semiconductor memory system according to the second embodiment of the present invention includes a memory having a memory cell array including a plurality of nonvolatile semiconductor memory cells, a control portion for controlling the memory, a network interface corresponding to a network protocol which can be connected to the network, a file management portion connected to the network interface for managing a relation between a data file given from the network and an address of the memory cell array, and a memory interface connected to the file management portion for converting a signal given from the network to a signal which can be used with the control portion.

Furthermore, the nonvolatile semiconductor memory device or nonvolatile semiconductor memory device system according to the second embodiment of the present invention can be appropriately combined with the first embodiment.

The nonvolatile semiconductor memory device or nonvolatile semiconductor memory device system in one example of the combination is provided with a first semiconductor substrate and a second semiconductor substrate. For example, on the first semiconductor substrate, a memory having a memory cell including a plurality of nonvolatile semiconductor memory cells is provided. For example, on the second semiconductor substrate, a control portion for controlling the memory, a network interface corresponding to the network protocol which can be connected to the network, and a file management portion connected to the network interface for managing a relation between a data file given from the network and an address of the memory cell array, and a memory interface connected to the file management portion for converting a signal given from the network to a signal which can be used at the control portion are provided.

In this manner, according to the second embodiment of the present invention, there can be provided one example of a nonvolatile semiconductor memory device or nonvolatile semiconductor memory device system provided with a file control system having an interface having a high affinity with many computer systems.

So far, the present invention has been explained according to the first and the second embodiments. However, the present invention is not limited to the embodiments. In the practice of the invention, the invention can be modified in various ways within the scope of not departing from the gist of the present invention.

Furthermore, each of the embodiments includes various stages of the invention. With an appropriate combination of a plurality of constituent elements, various stages of the invention can be extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a first semiconductor substrate, in which, a memory cell array including a plurality of nonvolatile semiconductor memory cells, a plurality of bit lines electrically connected to the memory cell array, a plurality of word lines electrically connected to the memory cell array, a plurality of input terminals, and a plurality of transfer gate transistors each having one end electrically connected to a corresponding one of the word lines and another end electrically connected to a corresponding to one of the input terminals, are provided; and
   a second semiconductor substrate, in which, a plurality of output terminals electrically connected to the input terminals of the first semiconductor substrate, and a word line control circuit configured to control the word lines and electrically connected to the output terminals, are provided.

2. The device according to claim 1, wherein the second semiconductor substrate stacked on the first semiconductor substrate.

3. The device according to claim 1, further comprising:
a plurality of first semiconductor substrates, wherein the second semiconductor substrate stacked on at least one of the plurality of first semiconductor substrates.

4. The device according to claim 1, further comprising:
a first package which seals the first semiconductor substrate, the first package having a plurality of first terminals electrically connected to the input terminals of the first semiconductor substrate, the first terminals being provided on a side surface of the first package;
a second package which seals the second semiconductor substrate, the second package having a plurality of second terminals electrically connected to the output terminals of the second semiconductor substrate, the second terminals being provided on a side surface of the second package; and
a plurality of wirings which electrically connects the first terminals of the first package and the second terminals of the second package, the wirings being provided on the side surfaces of the first package and the second package.

5. The device according to claim 4, wherein the second package is stacked on a surface different from the side surface of the first package.

6. The device according to claim 4, further comprising:
a plurality of first packages,
wherein the second package stacked on a surface different from the side surface of at least one of the first packages.

7. The device according to claim 4, further comprising:
a third package which seals the first package, the second package and the wirings.

8. The device according to claim 6, further comprising:
a third package which seals the first packages, the second package and the wirings.

9. A semiconductor integrated circuit device comprising:
a first semiconductor substrate, in which, a memory cell array including a plurality of nonvolatile semiconductor memory cells, a plurality of bit lines electrically connected to the memory cell array, a plurality of word lines electrically connected to the memory cell array, a plurality of input terminals, and a plurality of transfer gate transistors each having one end electrically connected to a corresponding one of the word lines and another end electrically connected to a corresponding to one of the input terminals, are provided; and
a second semiconductor substrate, in which, a plurality of output terminals electrically connected to the input terminals of the first semiconductor substrate, and a word line control circuit configured to control the word lines and electrically connected to the output terminals, an interface circuit, and a plurality of interface terminals electrically connected to the interface circuit, are provided.

10. The device according to claim 9, further comprising:
a first package which seals the first semiconductor substrate, the first package having a plurality of first terminals electrically connected to the input terminals of the first semiconductor substrate, the first terminals being provided on a side surface of the first package;
a second package which seals the second semiconductor substrate, the second package having a plurality of second terminals electrically connected to the output terminals of the second semiconductor substrate, and a plurality of third terminals electrically connected to the interface terminals of the second semiconductor substrate, the second terminals being provided on a side surface of the second package and the third terminals being provided on a side surface of the second package opposite to a lamination surface with the first package; and
a plurality of wirings which electrically connects the first terminals of the first package and the second terminals of the second package, the wirings being provided on the side surfaces of the first package and the second package.

11. The device according to claim 10, wherein the second package stacked on a surface different from the side surface of the first package.

12. The device according to claim 10, further comprising:
a plurality of first packages,
wherein the second package stacked on a surface different from the side surface of at least one of the first packages.

13. The device according to claim 10, further comprising:
a third package which seals the first package, the second package and the wiring, the third package having a plurality of fourth terminals electrically connected to the third terminals of the second package.

14. The device according to claim 12, further comprising:
a third package which seals the first packages, the second package and the wirings, the third package having a plurality of fourth terminals electrically connected to the third terminals of the second package.

15. A semiconductor integrated circuit device comprising:
a first semiconductor substrate, in which, a memory cell array including a plurality of nonvolatile semiconductor memory cells, a plurality of bit lines electrically connected to the memory cell array, a first shift register configured to control the bit lines, a plurality of word lines electrically connected to the memory cell array, a plurality of input terminals, a plurality of transfer gate transistors each having one end electrically connected to a corresponding one of the word lines and another end electrically connected to a corresponding to one of the input terminals, and a second shift register configured to control the transfer gate transistors, are provided; and
a second semiconductor substrate, in which, a plurality of output terminals electrically connected to the input terminals of the first semiconductor substrate, and a word line control circuit configured to control the word lines and electrically connected to the output terminals, are provided.

16. The device according to claim 15, wherein the second semiconductor substrate stacked on the first semiconductor substrate.

17. The device according to claim 15, further comprising:
a plurality of first semiconductor substrates, wherein the second semiconductor substrate is stacked on at least one of the plurality of first semiconductor substrates.

18. The device according to claim 15, wherein the second semiconductor substrate, in which, a storage circuit which stores an address of a defected memory cell in the memory cell array.

19. A nonvolatile semiconductor memory device comprising:
a first semiconductor substrate, in which, a memory having a memory cell array including a plurality of nonvolatile semiconductor memory cells, is provided; and a second semiconductor substrate, in which, a control portion configured to control the memory, a network interface connectable to a network, a file management portion connected to the network interface configured to manages a relation between a data file given from the network and an address of the memory cell array, and a memory interface connected to the file management portion configured to convert a signal given from the network to a signal which capable is of used at the control portion, are provided.

20. The device according to claim 19, wherein the second semiconductor substrate stacked on the first semiconductor substrate.

21. The device according to claim 19, further comprising:
a plurality of first semiconductor substrates, wherein the second semiconductor substrate is stacked on at least one of the plurality of first semiconductor substrates.

22. The device according to claim 19, further comprising:
a first package which seals the first semiconductor substrate, the first package having a plurality of first terminals electrically connected to the memory cell array, the first terminals being provided on a side surface of the first package; and a second package which seals the second semiconductor substrate, the second package having a plurality of second terminals electrically connected to the memory interface, and a plurality of third terminals electrically connected to the network interface, the second terminals being provided on a side surface of the second package and the third terminals being provided on a surface of the second package opposite to a lamination surface with the first package;

a plurality of wirings which electrically connects the first terminals of the first package and the second terminals of the second package, the wirings being provided on the side surfaces of the first package and the second package.

23. The device according to claim 22, wherein the second package stacked on a surface different from the side surface of the first package.

24. The device according to claim 22, further comprising:
a plurality of first packages,
wherein the second package stacked on a surface different from the side surface of at least one of the first packages.

25. The device according to claim 22, further comprising:
a third package which seals the first package, the second package and the wiring, the third package having a plurality of fourth terminals electrically connected to the third terminals of the second package.

26. The device according to claim 24, further comprising:
a third package which seals the first packages, the second package and the wirings, the third package having a plurality of fourth terminals electrically connected to the third terminals of the second package.

* * * * *

UNITED STATES PATENT AND TRADEMARK OFFICE
CERTIFICATE OF CORRECTION

PATENT NO.    : 6,768,163 B2
DATED         : July 27, 2004
INVENTOR(S)   : Tomoharu Tanaka et al.

It is certified that error appears in the above-identified patent and that said Letters Patent is hereby corrected as shown below:

Column 12,
Line 52, please replace "in which," with -- in which --

Column 13,
Lines 2 and 6, please replace "substrate stacked" with -- substrate is stacked --

Column 14,
Line 59, please replace ", in which," with -- includes --
Line 60, please replace "defected" with -- defective --
Line 64, please replace "in which," with -- in which --

Column 15,
Line 1, please replace "in which," with -- in which --
Line 9, please replace "capable is of" with -- is capable of being --
Line 12, please replace "substrate stacked" with -- substrate is stacked --

Column 16,
Lines 11 and 15, please replace "package stacked" with -- package is stacked --

Signed and Sealed this

Twenty-fourth Day of May, 2005

JON W. DUDAS
*Director of the United States Patent and Trademark Office*